(12) United States Patent
Ito

(10) Patent No.: US 6,916,118 B2
(45) Date of Patent: Jul. 12, 2005

(54) ROLLING BEARING WITH ROTATION SENSOR

(75) Inventor: Hiroyoshi Ito, Mie (JP)

(73) Assignee: NTN Corporation, Osaka (JP)

( * ) Notice: Subject to any disclaimer, the term of this patent is extended or adjusted under 35 U.S.C. 154(b) by 0 days.

(21) Appl. No.: 10/733,197

(22) Filed: Dec. 11, 2003

(65) Prior Publication Data

US 2004/0126043 A1 Jul. 1, 2004

Related U.S. Application Data

(62) Division of application No. 10/105,283, filed on Mar. 26, 2002, now abandoned.

(30) Foreign Application Priority Data

| Mar. 28, 2001 | (JP) | ................................. 2000-93176 |
| Apr. 2, 2001 | (JP) | ................................. 2001-103132 |
| May 25, 2001 | (JP) | ................................. 2001-156720 |
| Aug. 20, 2001 | (JP) | ................................. 2001-249038 |

(51) Int. Cl.$^7$ .............................................. F16C 19/06
(52) U.S. Cl. ...................................................... 384/448
(58) Field of Search ................................ 384/448, 446, 384/544; 324/174

(56) References Cited

U.S. PATENT DOCUMENTS 6,007,250 A    12/1999  Brauer et al.
6,043,643 A    3/2000   Message et al.
6,549,001 B1   4/2003   Dobbs et al.
6,559,633 B1   5/2003   Nachtigal et al.

FOREIGN PATENT DOCUMENTS

GB    1 604 861     12/1981
JP    11 264739      9/1999

*Primary Examiner*—Lenard A. Footland
(74) *Attorney, Agent, or Firm*—Wenderoth, Lind & Ponack, L.L.P.

(57) ABSTRACT

A compact rolling bearing with a rotation sensor is proposed which has a shortened axial length of a housing for mounting the rotation sensor. The rolling bearing comprises a rotating bearing ring and a fixed bearing ring, and the rotation sensor comprises a rotating element mounted to the rotating bearing ring and a detecting element mounted on the fixed bearing ring so as to oppose the rotating element, and an electric circuit board. The electric circuit board has a flexibility. With this arrangement, it is possible to mount the electric circuit board in a curved state in a limited space on a peripheral wall of the sensor housing, and thus to shorten the axial length of the sensor housing. This provides a compact rolling bearing with the rotation sensor. Another embodiment has a magnetic encoder, the binder for which is heat-resistant nitrile rubber, fluorine rubber or silicone rubber.

10 Claims, 30 Drawing Sheets

ROLLING BEARING WITH ROTATION SENSOR

This application is a Divisional Application of Ser. No. 10/105,283 filed Mar. 26, 2002 now abandoned.

BACKGROUND OF THE INVENTION

This invention relates to a rolling bearing with a rotation sensor having a detection element for detecting the number of revolutions or the rotating angle of an output shaft of an engine or a rotary shaft of a motor, the detection element being mounted on an electric circuit board having flexibility. It also relates to a rolling bearing with a rotation sensor characterized in the binder for the magnetic material of a magnetic encoder used therein.

As a method of detecting the number of revolutions and rotating angle, a method is known in which changes in magnetism with the rotation of a rotating element magnetized multipolarily on a ferromagnetic film around a rotary drum are detected by a detecting element and output as pulse signals.

Heretofore, if such a rotation sensor is mounted to a rolling bearing comprising, as shown in FIGS. 10A and 10B, an inner ring 2, an outer ring 3 and rolling elements 4, a rotating element 13 magnetized in multiple poles is mounted on the diametrically outer surface of the inner ring 2 which is a rotating bearing ring. An annular sensor housing 16 comprising, as shown in FIG. 11A in section, a peripheral wall 16a and a flange 16b extending inwardly is fixed to a core metal 5 fitted on the diametrically inner surface of the outer ring 3 which is a fixed bearing ring. The annular sensor housing 16 is formed with a groove 17 having such a section as shown in FIG. 11B. An electric circuit board 18 made of a glass fiber-containing epoxy resin which is superior in insulating performance and strength and has a thickness of about 1 mm is fitted in the groove 17 and mounted to the flange 16b. A detection element 9 is mounted on the electric circuit board 18 so as to be fitted on the inner peripheral surface of the peripheral wall 16a formed with the groove 17. Then, an electronic circuit part 10 is mounted on the surface of the board 18.

In this way, the rotation sensor comprising the rotating element 13 magnetized in multiple poles and the detection element 9 for detecting any change in magnetism due to the rotation of the former is mounted on the rolling bearing.

But as shown in FIGS. 10A and 10B, if the electric circuit board 18 is mounted to the flange 16b of the sensor housing 16, there is a disadvantage that the axial length L4 tends to be long because the axial length of the peripheral wall 16a has to be sufficient to house the rotating element 13 and the sensor housing 16 has to contain the electronic circuit part 10 which is mounted on the electric circuit board 18.

In order to eliminate such a disadvantage, it is conceivable to mount the electric circuit board 18 on the inner peripheral surface of the peripheral wall 16a of the sensor housing 16. But while the electric circuit board 18 made of a glass fiber-containing epoxy resin is high in mechanical strength, it has low elasticity and is hard and easy to break. Thus it is impossible to mount it arcuately on the inner peripheral surface of the peripheral wall 16a.

In order to mount the electric circuit board 18, which is made of an epoxy resin, on the inner peripheral surface of the peripheral wall 16a of the sensor housing 16 without cracking it, as shown in FIGS. 12A and 12B, it is necessary to split the electric circuit board 18 into split boards 18a. In order to mount the split boards 18a on the inner peripheral surface of the peripheral wall 16a of the sensor housing 16, it is necessary to form grooves 17a for receiving the split boards 18 in the inner peripheral surface and fix them in the respective grooves 17a. This is troublesome and incurs increase in manufacturing cost.

An object of this invention is therefore to provide a compact bearing with a rotation sensor by shortening the axial length of a housing needed for mounting the rotation sensor.

FIG. 13 shows another conventional rolling bearing with a rotation sensor. In this rolling bearing, the inner ring 2 is a rotating bearing ring. A core metal 102 is fitted on the inner ring 2. The core metal 102 includes a fixed portion 102a and a flange portion 102b. The fixed portion 102a is fitted on the outer peripheral surface of the inner ring 2. A magnetic encoder 101 is fixed to the outer peripheral surface of the flange portion 102b. The magnetic encoder 101 is made of a magnetic material (such as a ferrite) joined by a binder.

To the outer ring 3, which is a fixed bearing ring, an S-shaped core metal 5 for mounting a sensor housing 16 is fixed. The sensor housing 16 has a built-in sensor element 11 which detects change in magnetism of the magnetic encoder 101. Here, the sensing direction is radial.

As the binder for the magnetic encoder 101, generally, a thermoplastic resin such as polyamide (PA) and polyphenylene sulfide (PPS) or nitrile rubber (NBR) is used.

If a thermoplastic resin (plastic) is used for the binder for the magnetic encoder 101, the latter is molded simultaneously with the core metal 102 or pressed into or bonded to the core metal after molding.

But if a thermoplastic resin such as polyamide or polyphenylene sulfide is used for the binder for the magnetic material of the magnetic encoder 101, the magnetic accuracy of the magnetic encoder 101 may deteriorate if the bearing is left in a low-temperature or a high-temperature environment or in an environment where temperature fluctuations are repeated from high to low temperature over a wide temperature range (e.g. −40° C. to 130° C.).

Also, with a bearing in which the magnetic encoder 101 is pressed into the core metal 102 or the magnetic encoder 101 and the core metal 102 are simultaneously molded, cracks may develop during manufacture or if they are used in an environment in which temperature fluctuations are large.

If nitrile rubber is used as the binder, cracks may develop in an environment in which it is used at the upper limit of the above temperature range.

Thus, another object of the present invention is to provide a rolling bearing with a rotation sensor which can suppress deterioration of the magnetic accuracy even if left in a high-temperature or low-temperature environment or in an environment in which the temperature fluctuates repeatedly, and which can suppress cracks during manufacture or if used in an environment in which the temperature fluctuation is large or in a high-temperature environment.

SUMMARY OF THE INVENTION

According to the present invention, there is provided a rolling bearing with a rotation sensor, the rolling bearing comprising a rotating bearing ring and a fixed bearing ring, the rotation sensor comprising a rotating element mounted to the rotating bearing ring, a detecting element mounted on the fixed bearing ring so as to oppose the rotating element, and an electric circuit board, characterized in that the electric circuit board has a flexibility.

With this arrangement, the electric circuit board can be easily bent and fitted in a limited space without cracking and without splitting it as mentioned above. This makes it possible to compactly design a rolling bearing having a rotation sensor.

Also, since the electric circuit board can have its degree of bending varied easily, it is possible to use electric circuit boards of the same specification for rolling bearings of different model numbers.

The electric circuit board is preferably formed of a plastic film.

With this arrangement, it has flexibility and good insulating property required for electric circuit boards is obtained. Also, it is possible to make the thickness of the board thin compared with a conventional board made of a glass fiber-containing epoxy resin.

The electric circuit board is preferably mounted in a bent state to the inner peripheral surface of the annular sensor housing fixed to one end of the fixed bearing ring.

Since the electric circuit board is flexible, it is possible to easily bend and mount it along the peripheral wall, so that there is no need to mount the electric circuit board 18 on the flange 16b of the sensor housing as shown in FIGS. 10A, 10B. Thus, the axial length L4 of the sensor housing 16 can be shortened, so that the rolling bearing can be designed compactly.

Preferably, the sensor housing comprises a peripheral wall and a flange extending inwardly therefrom, and the electric circuit board is mounted to the flange so that the board surface will be perpendicular to the axis of the rolling bearing.

Since the electric circuit board is formed filmy, it is thinner than the above-described conventional electric circuit board 18 made of an epoxy resin. Thus, even if it is mounted to the flange 16b of the sensor housing 16 to mount an electronic circuit part 10 as shown in FIGS. 10A, 10B, since the amount of protrusion is small compared with the conventional arrangement, the axial length L4 of the sensor housing can be shortened, which makes it possible to compactly design the rolling bearing.

The detection element may be provided so as to be adjacent to and oppose the rotating element with respect to the radial direction.

With this arrangement, even if the electric circuit board is mounted to either of the peripheral wall or flange of the sensor housing, the detecting element can be easily mounted to the electric circuit board.

The detecting element may be provided so as to be adjacent to and oppose the rotating element with respect to the axial direction.

With this arrangement too, the detecting element can be easily mounted to the electric circuit board which is mounted to the peripheral wall or flange of the sensor housing.

According to the present invention, there is also provided a bearing with a rotation sensor comprising an inner ring, an outer ring and a plurality of rolling elements disposed between the inner ring and the outer ring, one of the inner ring and the outer ring forming a rotating bearing ring and the other forming a fixed bearing ring, wherein a core metal to which is fixed a sensor housing including a sensor element is mounted to the fixed bearing ring, and a core metal to which is fixed a magnetized magnetic encoder is mounted to the rotating bearing ring, whereby the rotation of the rotating bearing ring is detected by changes in polarity which are received by a sensor sensitive surface of the magnetic encoder, which opposes the sensor element, characterized in that a binder for the magnetic material of the magnetic encoder comprises a heat-resistant rubber.

According to the bearing with the rotation sensor of the present invention, by using a heat-resistant rubber for the binder for the magnetic material of the magnetic encoder, it is possible to improve the temperature properties of the magnetic encoder, and to suppress cracks of the magnetic encoder. Thus, it is possible to suppress deterioration in the magnetic accuracy even if left in a high-temperature or low-temperature environment or in an environment in which the temperature fluctuates repeatedly, and to suppress cracks during manufacture or during use in an environment in which the temperature fluctuation is large or in a high-temperature environment.

In this bearing with the rotation sensor, the heat-resistant rubber comprises one or more material selected from the group consisting of heat-resistant nitrile rubber, fluorine rubber and silicone rubber.

Thus, it is possible to suitably select various kinds of heat-resistant rubber materials. If these materials are used singly or in combination, it is possible to improve the temperature properties of the magnetic encoder and suppress cracks of the magnetic encoder.

Other features and objects of the present invention will become apparent from the following description made with reference to the accompanying drawings, in which:

DETAILED DESCRIPTION OF THE PREFERRED EMBODIMENT

Hereinbelow, a first embodiment of this invention will be described with reference to FIGS. 1 and 2.

Figure 1A:
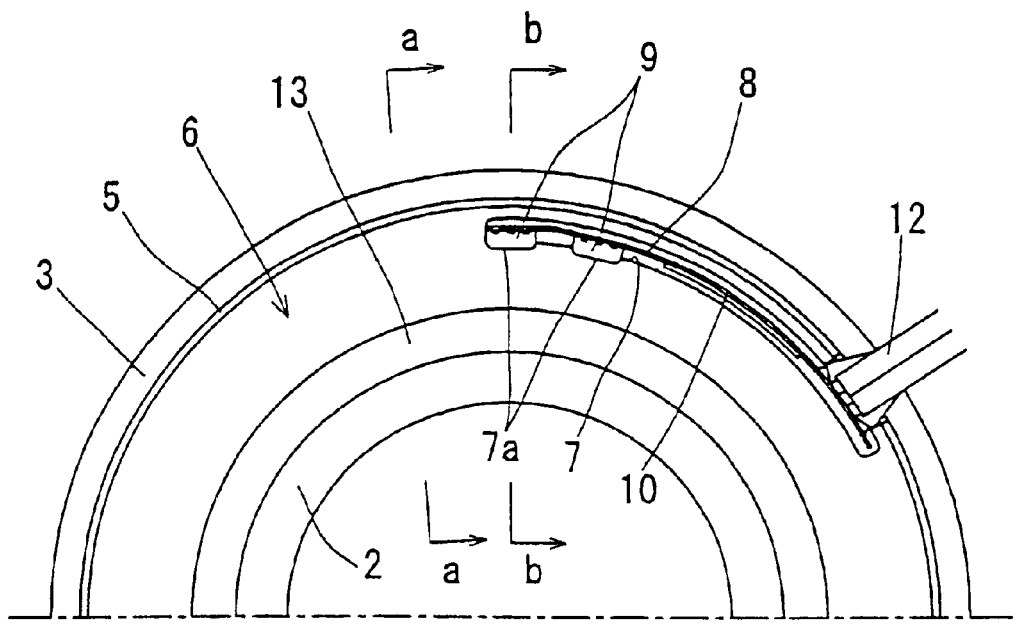
FIG. 1A is a partially cutaway front view of the rolling bearing with a rotation sensor of one embodiment of this invention.
Figure 1B:
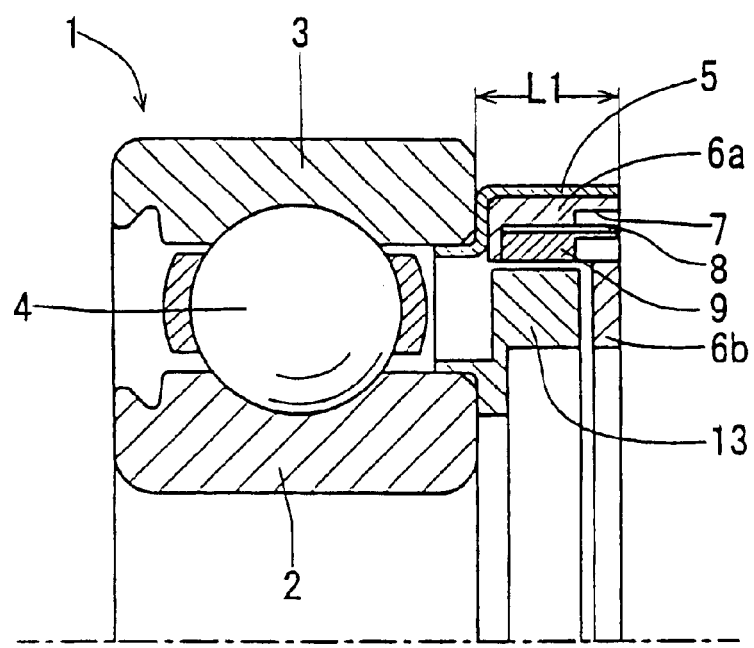
FIG. 1B is an enlarged vertical sectional side view along line b—b of FIG. 1A.

The rolling bearing 1 with a rotation sensor according to this invention includes, as shown in FIGS. 1A and 1B, an inner ring 2, an outer ring 3, rolling elements 4, and a rotating element 13 including a magnetic encoder which is magnetized multipolarily on a ferromagnetic film around a rotating drum. The rotating element 13 is mounted on the diametrically outer surface of the inner ring 2 which is a rotating bearing ring.

Figure 2A:
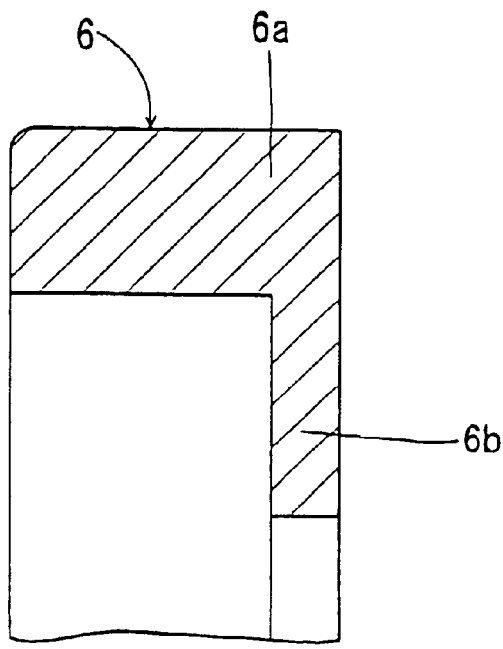
FIG. 2A is an enlarged vertical sectional side view of the sensor housing along line a—a of FIG. 1.
Figure 2B:
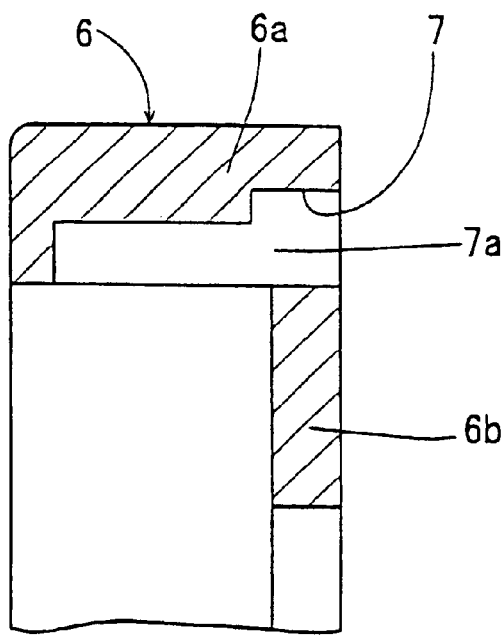
FIG. 2B is an enlarged vertical sectional side view of the sensor housing along line b—b of FIG. 1.

An annular sensor housing 6, of which the sectional shape is shown in FIG. 2A, comprises a peripheral wall 6a and a flange 6b and is concentrically mounted on a core metal 5 fitted on the diametrically inner surface of the outer ring 3 which is a fixed bearing ring. In the flange 6b of the sensor housing 6, an arcuate groove 7 is formed which has a sectional shape as shown in FIG. 2B and has two recesses 7a.

An electric circuit board 8 is bent and mounted on the inner peripheral surface of the peripheral wall 6a of the sensor housing 6. The electric circuit board 8 is made of polyethylene terephthalate which is superior in electrical insulating property. It has a thickness of about 200 µm and is filmy and flexible and provides required insulating performance. For the electric circuit board 8, any other thermoplastic plastic film may be used which is superior in electrical insulating property, such as polyethylene, polyimide or vinyl chloride. Such plastic films can be formed by conventional film forming method such as rolling or extrusion.

At one end of the electric circuit board 8, detection elements 9 are fitted in the recesses 7a of the groove 7 so as to be radially adjacent to and oppose the rotating element 13. An electronic part 10 for removing noise such as power source noise is mounted in the center of the electric circuit board 8. The rotation sensor is thus formed. Change in magnetism of the magnetic encoder with the rotation of the rotating element 13 is detected by the detection elements 9, which output pulse signals so that the rotating speed of the rolling bearing 1 can be measured. At the other end of the electric circuit board 8, a power cable 12 is connected.

The first embodiment of this invention has such a structure and its operation will be described below.

Figure 12A:
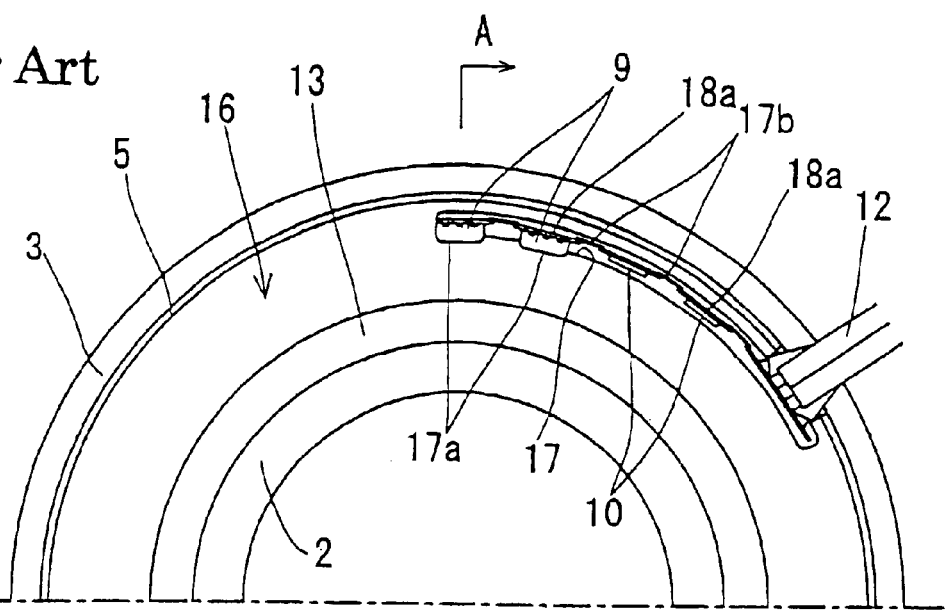
FIG. 12A is a partially omitted front view of another prior art rolling bearing with a rotation sensor.
Figure 12B:
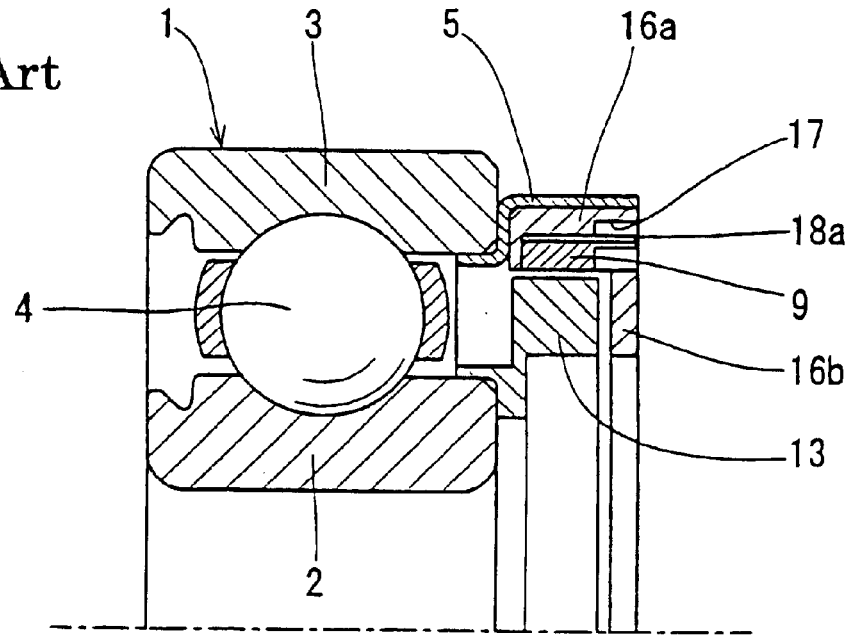
FIG. 12B is an enlarged vertical sectional side view along line A—A of FIG. 12A.
Figure 13:
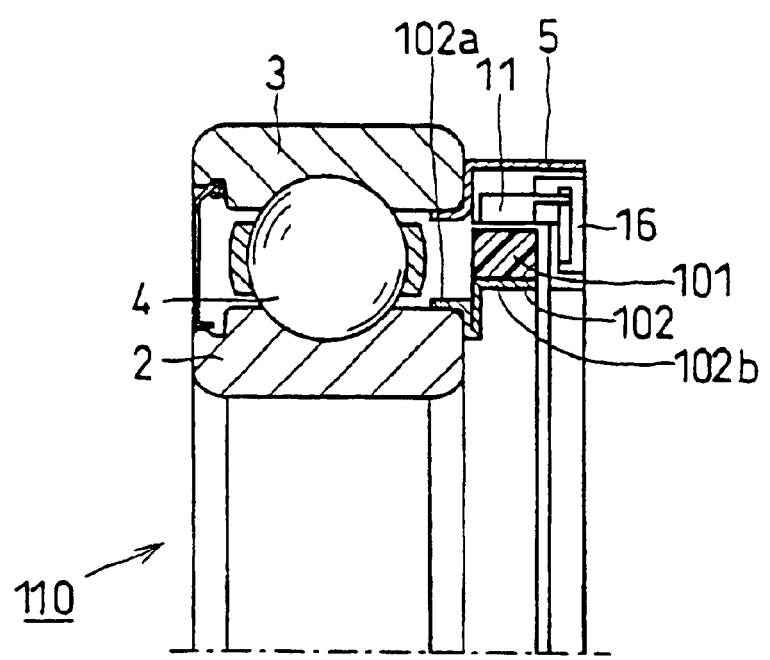
FIG. 13 is a partial sectional view showing another conventional bearing with a rotation sensor.

Since the electric circuit board 8 is formed filmy, compared with a conventional board made of a glass fiber-containing epoxy resin, it can be made much thinner. Since the electric circuit board 8 has flexibility, it will not crack even if bent. Also, without the need to split the electric circuit board 8 as with the split boards 18a shown in FIGS. 12A and 12B, it can be easily fitted arcuately on the inner peripheral surface of the peripheral wall 6a of the annular sensor housing 6. Since the electric circuit board 8 does not have to be mounted to the flange 6b, the axial length L1 of the sensor housing 6 will be shorter than the axial length L4 shown in FIG. 10. Thus the rolling bearing 1 can be designed to be more compact.

Also, if the rolling bearing 1 is of a different model, the curvature of the inner peripheral surface of the peripheral wall 6a of the sensor housing 6 may be different. Even so, it is possible to fit the electric circuit board 8 by changing the degree of bending or curvature. Thus, electric circuit boards 8 of the same specification can be used for rolling bearings of different models. This is economical.

Figure 3:
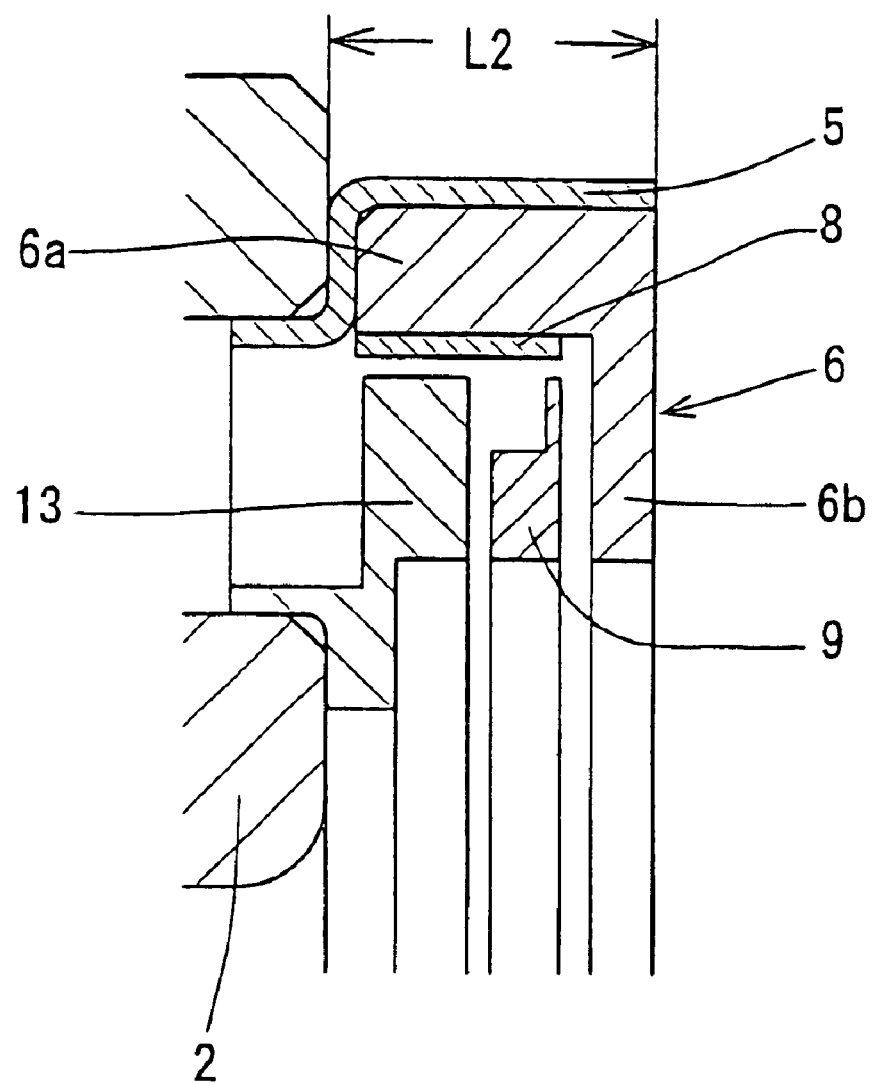
FIG. 3 is a partially omitted enlarged vertical sectional side view of another embodiment.

In the second embodiment shown in FIG. 3, as in the first embodiment shown in FIG. 1, an electric circuit board 8 is fitted on the inner peripheral surface of a peripheral wall 6a of an annular sensor housing 6. A detection element 9 is arranged so as to be axially adjacent to and oppose the rotating element 13 fitted on the inner ring 2. The opposed surface of the rotating element 13 is magnetised multipolarily on a ferromagnetic film. A rotation sensor is thus formed. With this arrangement too, as in the embodiment shown in FIG. 1, the axial length L2 of the sensor housing 6 is shorter than the length L4 in the arrangement of the prior art (see FIGS. 10A and 10B).

Figure 4A:
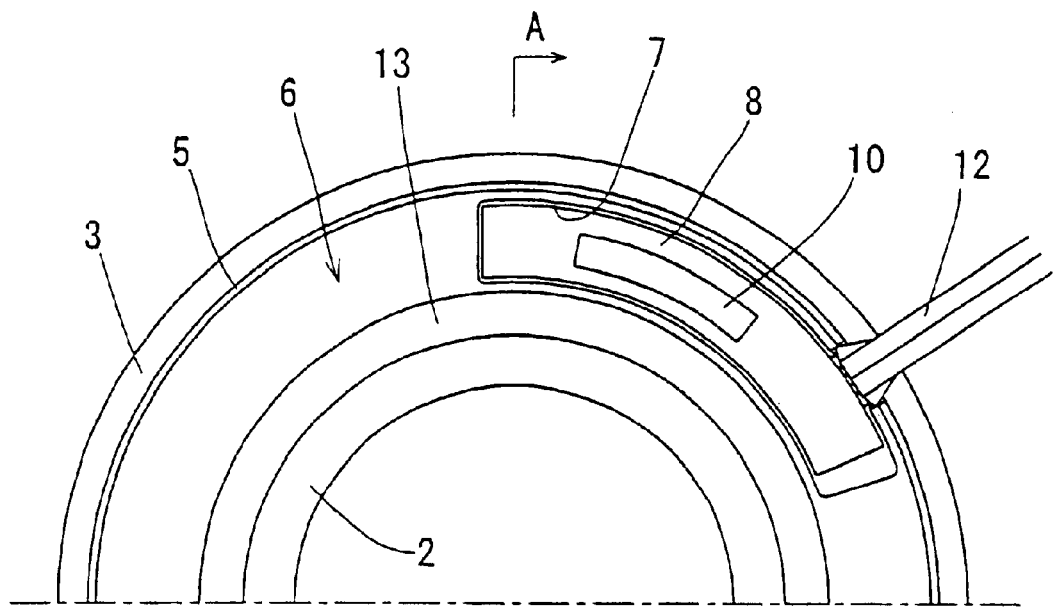
FIG. 4A is a partially omitted front view of a still another embodiment.
Figure 4B:
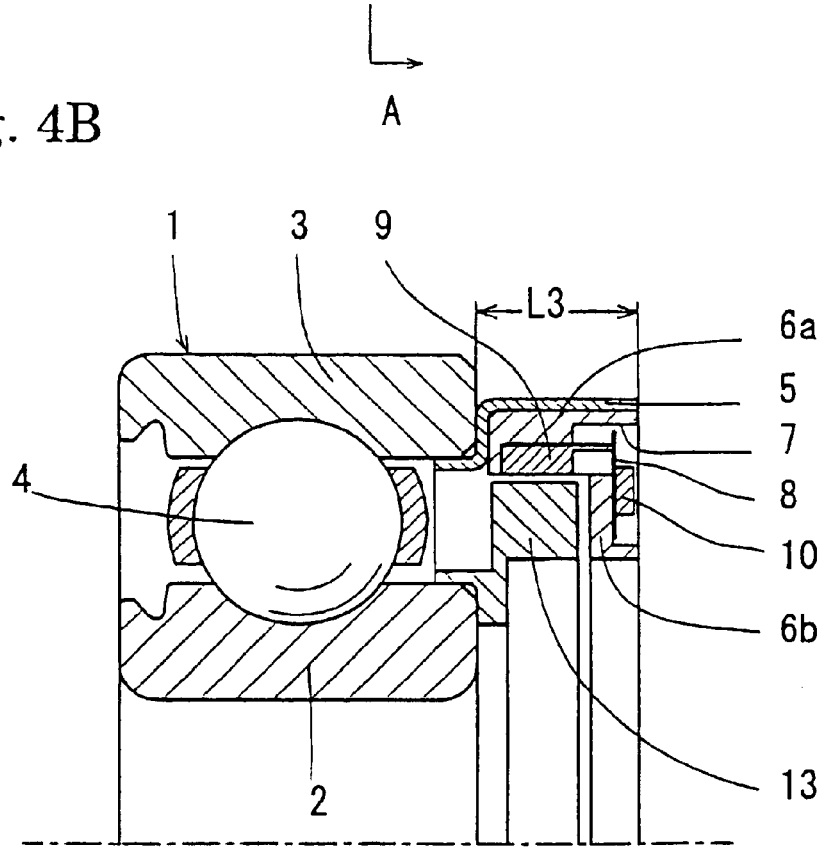
FIG. 4B is an enlarged vertical sectional side view along line A—A of FIG. 4A.
Figure 10A:
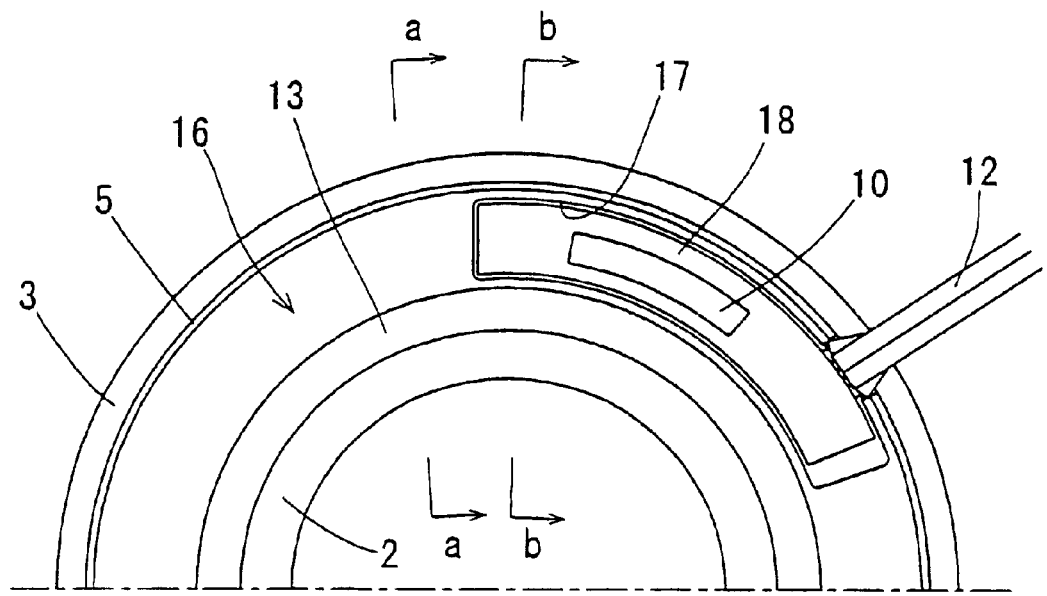
FIG. 10A is a partially omitted front view of a prior art rolling bearing with a rotation sensor.
Figure 10B:
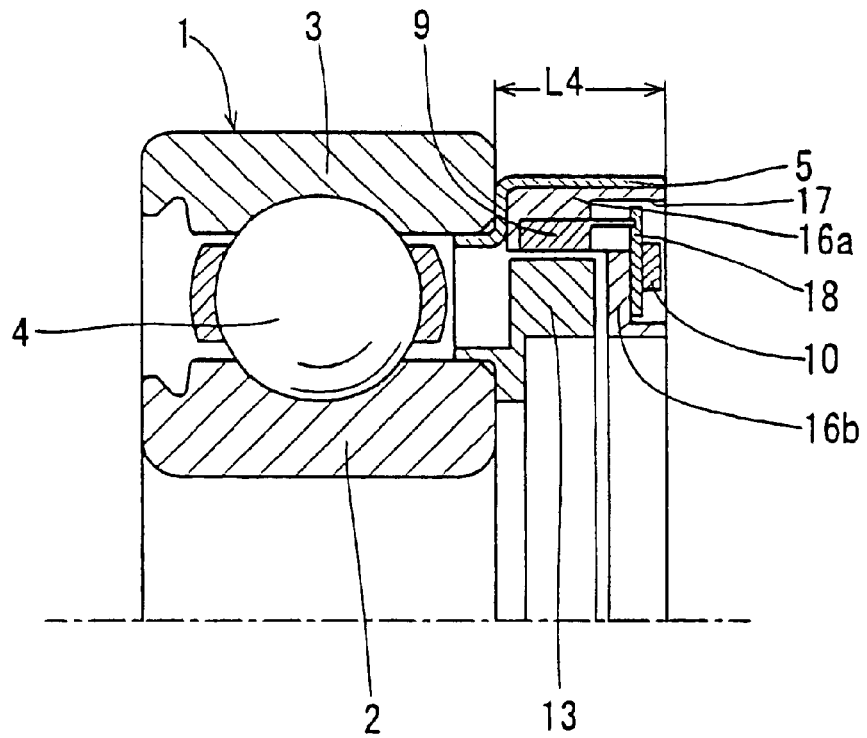
FIG. 10B is an enlarged vertical sectional side view along line a—a of FIG. 10A.
Figure 11A:
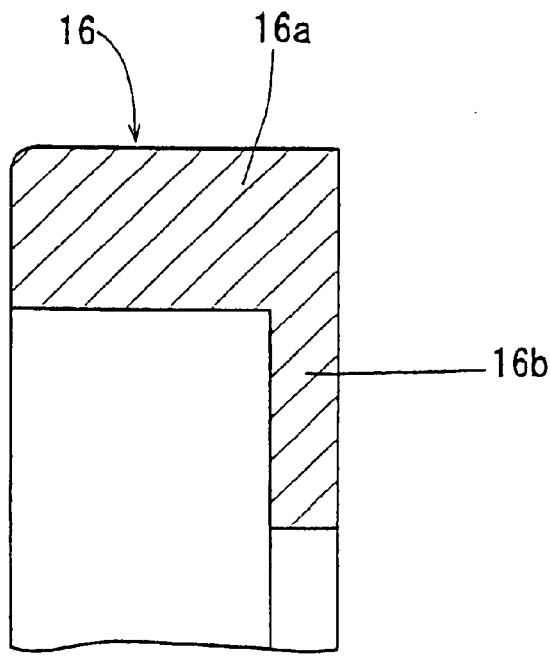
FIG. 11A is an enlarged vertical sectional side view of the sensor housing along line a—a of FIG. 10A.
Figure 11B:
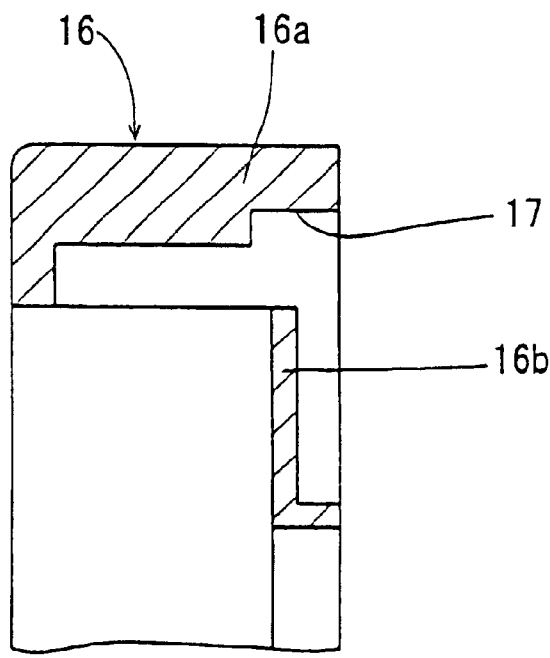
FIG. 11B is an enlarged vertical sectional side view of the sensor housing along line b—b of FIG. 10A.

In the third embodiment shown in FIGS. 4A and 4B, as in the arrangement of the electric circuit board 18 shown in FIGS. 10A and 10B, the electric circuit board 8 is mounted to the flange 6b of the sensor housing 6 fixed to the core metal 5 fitted on the inner surface of the outer ring 3 at its outer end. A detection element 9 is mounted on the electric circuit board 8 so as to fit on the inner peripheral surface of the peripheral wall 6a of the sensor housing 6 formed with a groove 7. An electronic circuit part 10 is mounted on the surface of the board 8.

Although the electric circuit board 8 is mounted on the flange 6b of the sensor housing 6 as with the conventional arrangement, since the electric circuit board 8 used is filmy and its thickness is smaller than the thickness of the electric circuit board made of an epoxy resin, the axial length L3 of the sensor housing 6 can be made shorter than the length L4 in the conventional arrangement. In this embodiment, too, the detection element 9 can be fitted so as to be axially adjacent to and oppose the rotating element 13 as shown in FIG. 3.

In the embodiments shown in FIGS. 1–3, the core metal 5 for fixing the sensor housing 6 is fitted on the diametrically inner surface of the outer ring 3 of the rolling bearing 1 at its end. But it may be fitted on the diametrically outer surface of the outer ring 3 at its end.

If the rotating bearing ring is the outer ring, a rolling bearing with a rotation sensor may be formed by mounting the rotating element on the diametrically inner or outer surface of the outer ring at its end, fitting the core metal on the diametrically outer surface of the inner ring (which is the fixed bearing ring) at its end, fixing the sensor housing to the core metal, and as in the embodiments shown in FIGS. 1, 3 and 4, mounting the detection element on the filmy electric circuit board so as to be adjacent to and oppose the rotating element.

Next, the fourth embodiment of the present invention will be described below.

Figure 5:
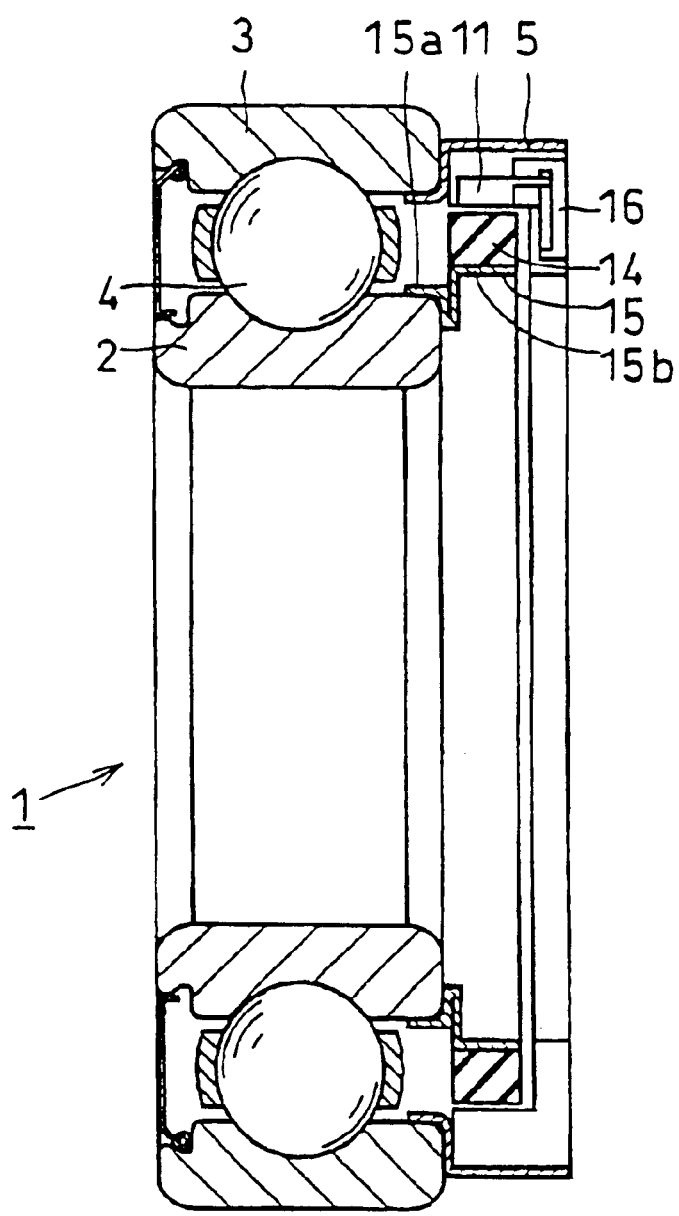
FIG. 5 is a sectional view of another embodiment of the present invention.

In FIG. 5, the rolling bearing 1 with a rotation sensor of this embodiment has a magnetic encoder 14, a core metal 15, an outer ring 3, an inner ring 2, rolling elements 4, a core metal 5, a sensor housing 6 and a sensor element 11.

The outer ring 3, inner ring 2 and rolling elements 4 forms the rolling bearing. The inner ring 2 is a rotating bearing ring. The core metal 15 is mounted to the inner ring 2. The core metal 15 includes a fixed portion 15a and a flange portion 15b and the fixed portion 15a is fixedly mounted on the outer peripheral surface of the inner ring. The magnetic encoder 14 is fixed to the outer peripheral surface of the flange portion 15b.

The outer ring 3 is a fixed bearing ring. The core metal 5, which has an S-shaped section and serves to mount the sensor housing 6, is fixed to the outer ring 3. The sensor element 11 is built in the sensor housing 6 and opposes the magnetic encoder 14. The rotation of the inner ring 2 is detected in terms of changes in magnetic flux sensed by a sensitive surface of the magnetic encoder 14. Here, the sensing direction is radial.

Figure 6:
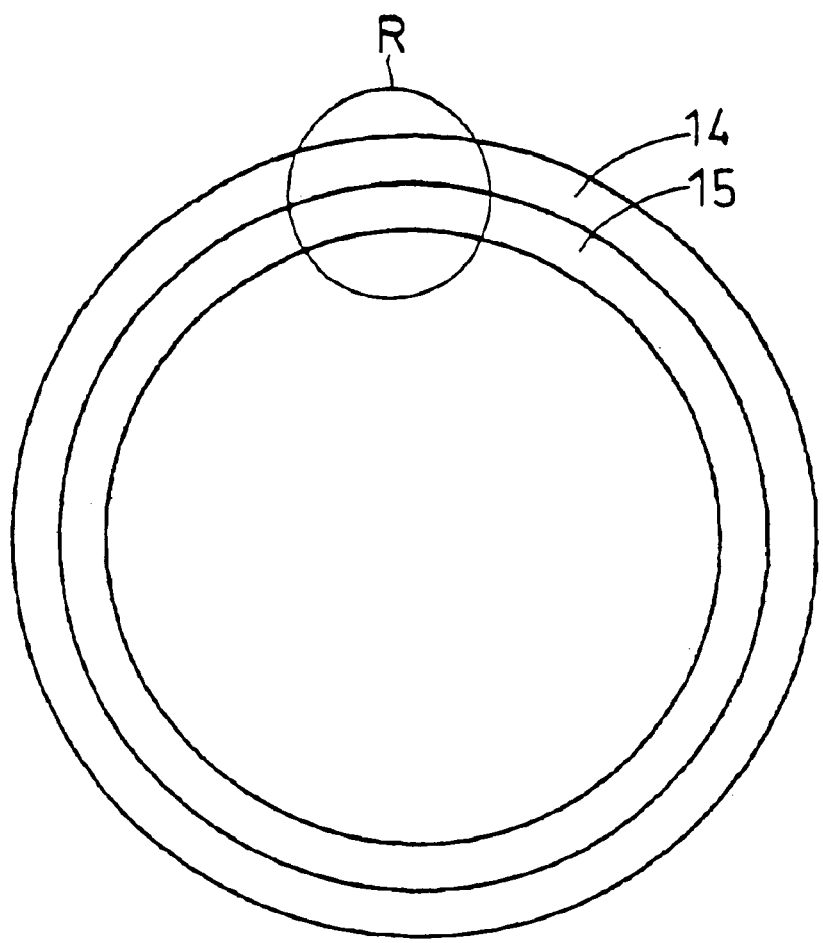
FIG. 6 is a front view showing the core metal and the magnetic encoder of the same.
Figure 7:
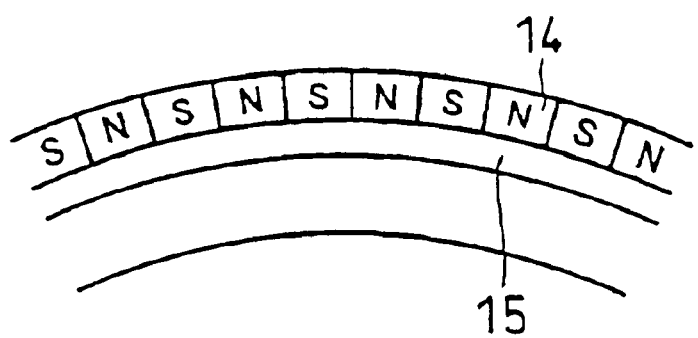
FIG. 7 is an enlarged view of the area R of FIG. 6.

As shown in FIG. 6, the core metal 15 has an annular shape. The magnetic encoder 14 is mounted on the outer peripheral surface of the core metal 15. As shown in FIG. 7, the magnetic encoder 14 has a so-called multipolarily magnetized structure in which N and S poles are alternately magnetized in a circumferential direction.

In this embodiment, the magnetic encoder 14 has a magnetic material (such as ferrite) bound by a binder. As the binder, e.g. a heat-resistant rubber is used. Also, the magnetic encoder 14 is fixed to the core metal 2 by vulcanizing the heat-resistant rubber.

For the material of the heat-resistant rubber, generally, heat-resistant nitrile rubber (HNBR), fluorine rubber (FKM) and silicone rubber (VMQ) may be used. In this embodiment, these materials are used singly or in combination.

Figure 8:
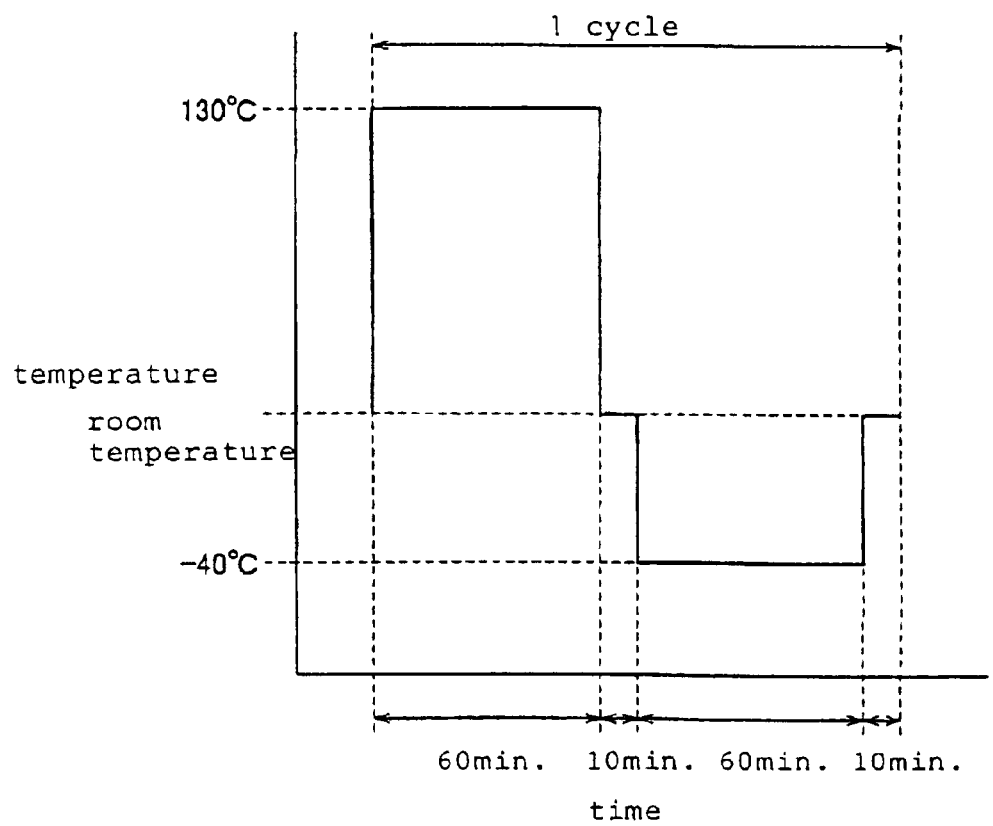
FIG. 8 is a view showing the cycle conditions in a heat shock test.

The present inventors examined changes in magnetized pitch error of the magnetic encoder by a heat shock test for different materials of the magnetic encoder. Using polyamide, polyphenylene sulfide and heat-resistant nitrile rubber as the binder, the heat cycle shown in FIG. 8 was applied by 250 and 500 cycles and the magnetized pitch error after the heat shock test was measured. The results are shown in FIG. 9.

Figure 9:
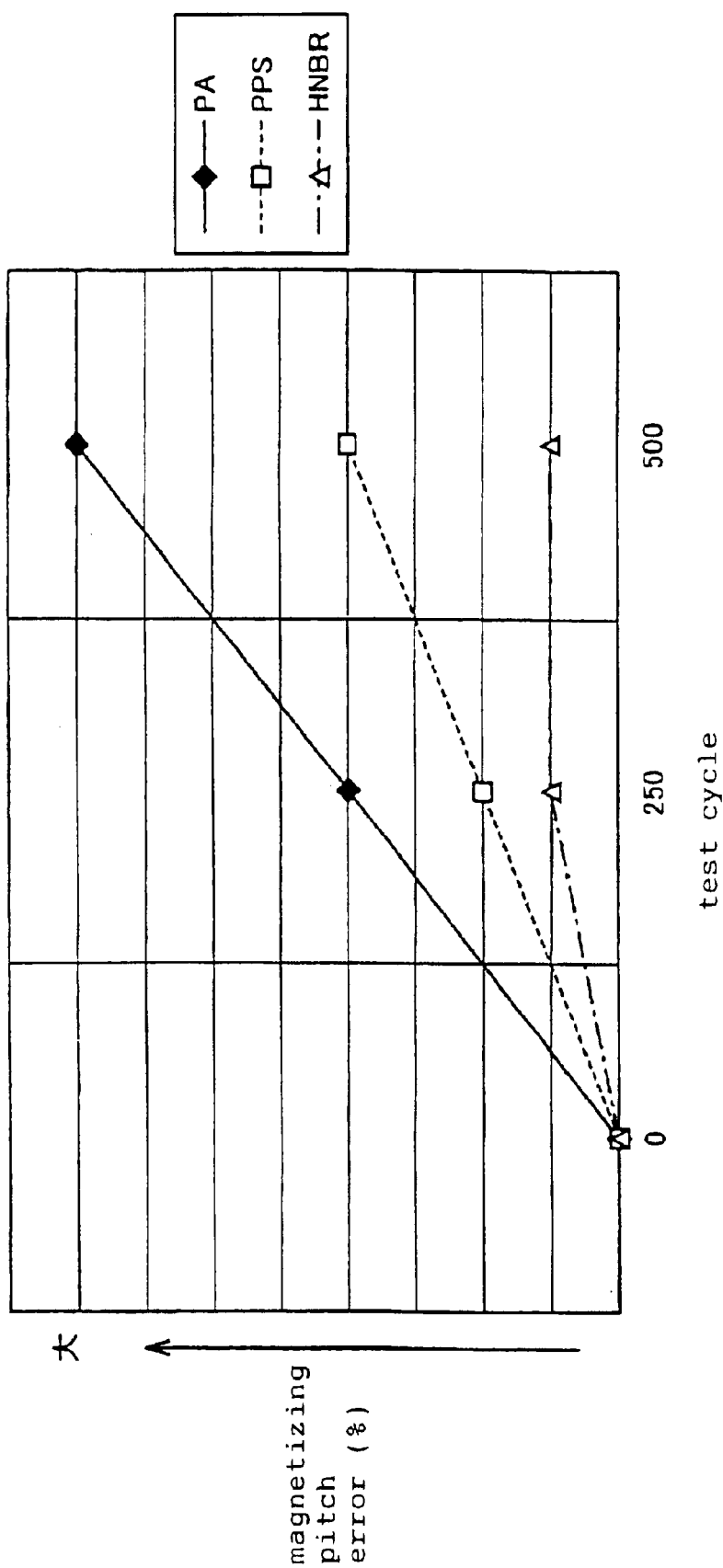
FIG. 9 is a view showing the results of the heat shock test.

It can be seen from FIG. 9 that when polyamide or polyphenylene sulfide is used as the binder, the magnetized pitch error after the heat shock test extremely deteriorated, compared to when heat-resistant nitrile rubber is used.

Also, if heat-resistant nitrile rubber is used, the magnetic encoder 14 can be bonded by vulcanization to the core metal 15, so that cracks will not occur when the magnetic encoder is mounted to the core metal by pressing as with polyamide or polyphenylene sulfide. Also, even if the heat-resistant nitrile rubber is used in a high-temperature environment, cracks will not occur since its heat resistance is high.

In the above test, description was made about heat-resistant nitrile rubber. But for fluorine rubber and silicone rubber, similar results were obtained.

In this embodiment, as the heat-resistant rubber, heat-resistant nitrile rubber, fluorine rubber and silicone rubber were described. But it is not limited to these materials. Any other heat-resistant rubber material can be used which can suppress deterioration of magnetic accuracy even if the bearing is left in a low or high-temperature environment or in an environment where temperature fluctuations are repeated, and can suppress cracks even during manufacture or during use in a environment where temperature fluctuations are large or in a high-temperature environment.

The fifth embodiment of this invention will be described with reference to FIGS. 14 to 23.

Figure 14A:
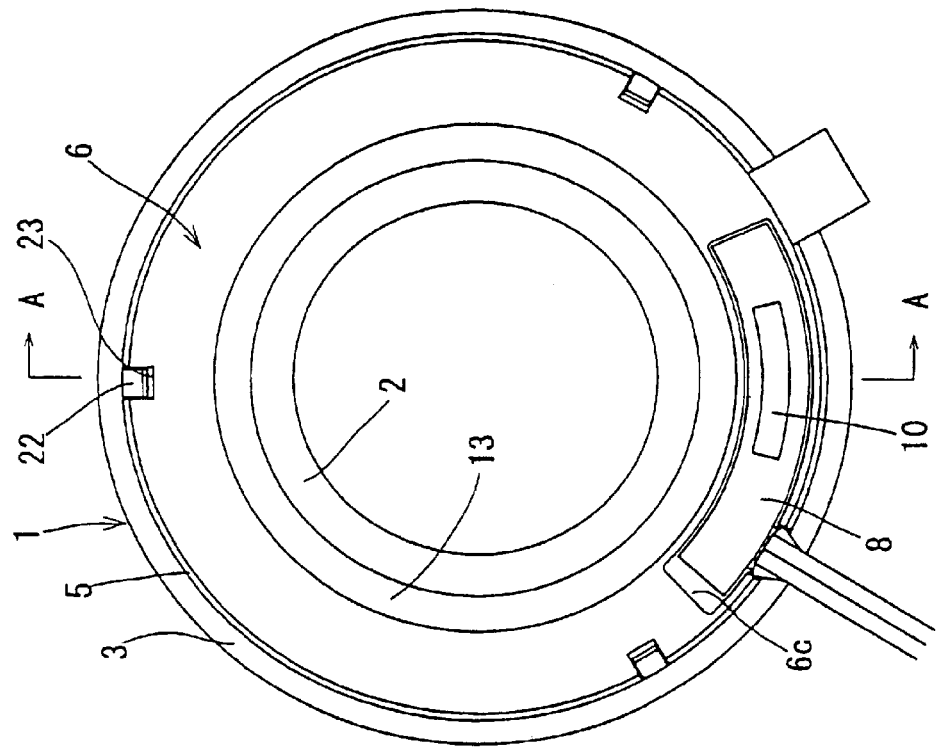
FIG. 14A is a front view of the fifth embodiment.
Figure 14B:
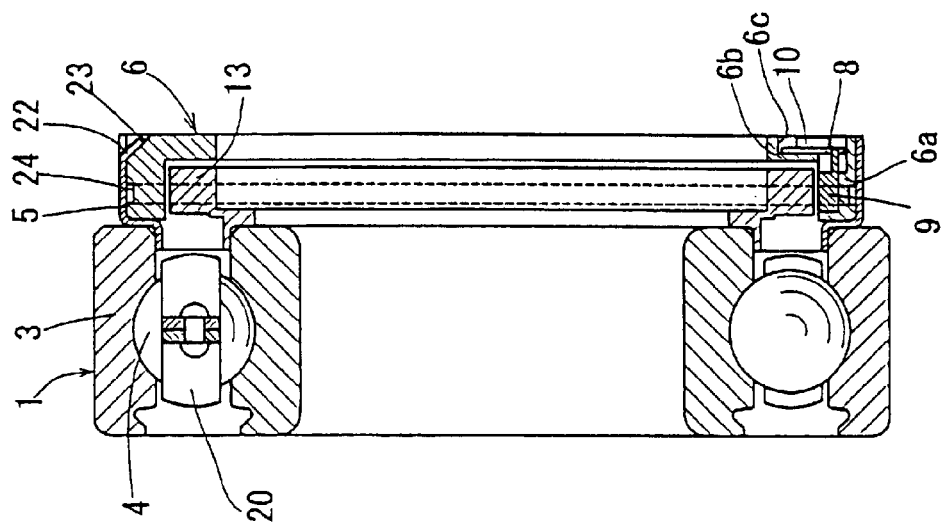
FIG. 14B is a vertical sectional side view taken along line A—A of FIG. 14A.

In this embodiment, a rotating element 13 is fitted on the diametrically outer surface of the inner ring 2 which is the rotating bearing ring, as shown in FIGS. 14A and 14B. Rolling elements 4 are retained by a retainer 20. An annular sensor housing 6 made of a synthetic resin and having a peripheral wall 6a and a flange 6b is fitted on a core metal 5 fitted on the diametrically inner surface of the outer ring 3 which is the fixed bearing, using hydraulic pressure with an interference.

An electric circuit board 8 is mounted in a groove 6c formed in the flange 6b of the sensor housing 6. Through the electric circuit board 8, a detection element 9 is mounted on the inner peripheral surface of the peripheral wall 6a so as to be opposite and adjacent the rotating element 13 in the radial direction and an electronic circuit part 10 is mounted on the circuit board 8 to form the rotation sensor. The detection element 9 detects a change in magnetism due to rotation of the rotating element 13 and outputs a pulse signal to measure the rotating speed of the rolling bearing 1.

Figure 15:
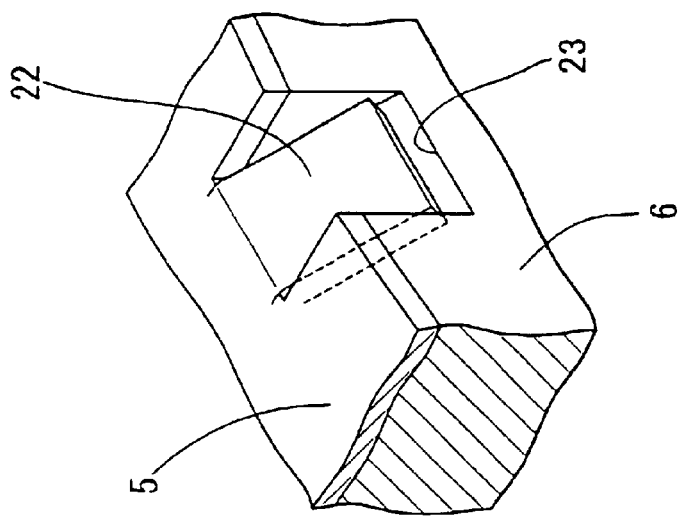
FIG. 15 is a perspective view showing how the sensor housing is fixed to the core metal.

At the end on the large-diameter side of the core metal 5, as shown in FIG. 15, claw-like engaging pieces 22 are formed at three locations in the circumferential direction. Opposite to the engaging pieces 22, on the outer surface of a corner portion extending from the peripheral wall 6a to the flange 6b of the sensor housing 6, cutout grooves 23 are formed at three locations in the circumferential direction. The engaging pieces 22 are bent and engaged in the grooves 23 to fix the core metal 5 and the sensor housing 6 together.

On the outer periphery of the peripheral wall 6a of the sensor housing 6, an adhesive-filling groove 24 is formed continuously in the circumferential direction. It is filled with an adhesive containing a silicon polymer and an epoxy resin as major components and having elasticity to bond the sensor housing 6 to the core metal 5.

By fitting protrusions formed by bending the engaging pieces 22 formed on the core metal 5 into the grooves 23 or recesses formed in the sensor housing 6 and bonding the core metal 5 and the sensor housing 6 together with the adhesive, the sensor housing 6 pressed in is fixed to the core metal 5. The core metal 5 may be fitted on the diametrically outer surface of the outer ring 3 at its end.

Since the sensor housing 6 is bonded to the core metal 5 by an adhesive having elasticity, even if the sensor housing radially shrinks if the rolling bearing is used in a low-temperature region, the adhesive elastically deforms, so that the bonded state between the core metal 5 and the sensor housing 6 is maintained. Thus, no radial shaking will occur and the sensor housing 6 is prevented from inclining. Also, even if a shearing force greater than the bonding ability of the adhesive acts in the axial or circumferential direction due e.g. to vibration between the core metal 5 and the sensor housing 6, since the engaging pieces 22 formed on the core metal 5 are fitted in the grooves 23 of the sensor housing 6, the sensor housing is prevented from moving axially and coming off or from displacing circumferentially.

Also, if the environmental temperature returns from a high-temperature range to a normal temperature, the sensor housing 6 can shrink and due to the creep deformation, the elastic recovery of interference is lost, so that the radial gap between the sensor housing 6 and the core metal 5 can grow. Even in such a situation, due to elasticity of the adhesive, the fixed state is maintained, so that radial shaking is prevented. Even in such a state, axial displacement between the core metal 5 and the sensor housing 6 resulting from axial expansion due to creep deformation is suppressed by engagement of the claw-like engaging pieces 22 in the grooves 23. This prevents the sensor housing 6 from coming out off the core metal 5 and circumferential displacement of the sensor housing.

Since the adhesive filling groove 24 is formed circumferentially continuously, the total bonding area increases, so that shaking in a radial direction can be prevented reliably. Further, the bonding capacity against shearing force that acts axially or circumferentially between the core metal 5 and the sensor housing 6 improves.

Simply by bending the claw-like engaging pieces 22 formed on the core metal 5 and fitting them in the grooves 23 formed in the sensor housing 6, it is possible to easily fix the core metal 5 and the sensor housing 6 together, and prevent coming off in the axial direction and circumferential displacement of the sensor housing.

Figure 16A:
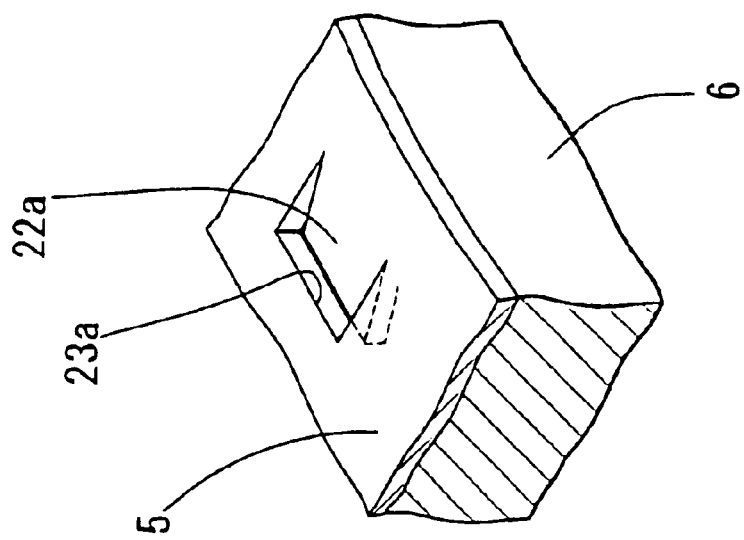
FIG. 16A is a perspective view showing another example of the method of fixing the sensor housing.
Figure 16B:
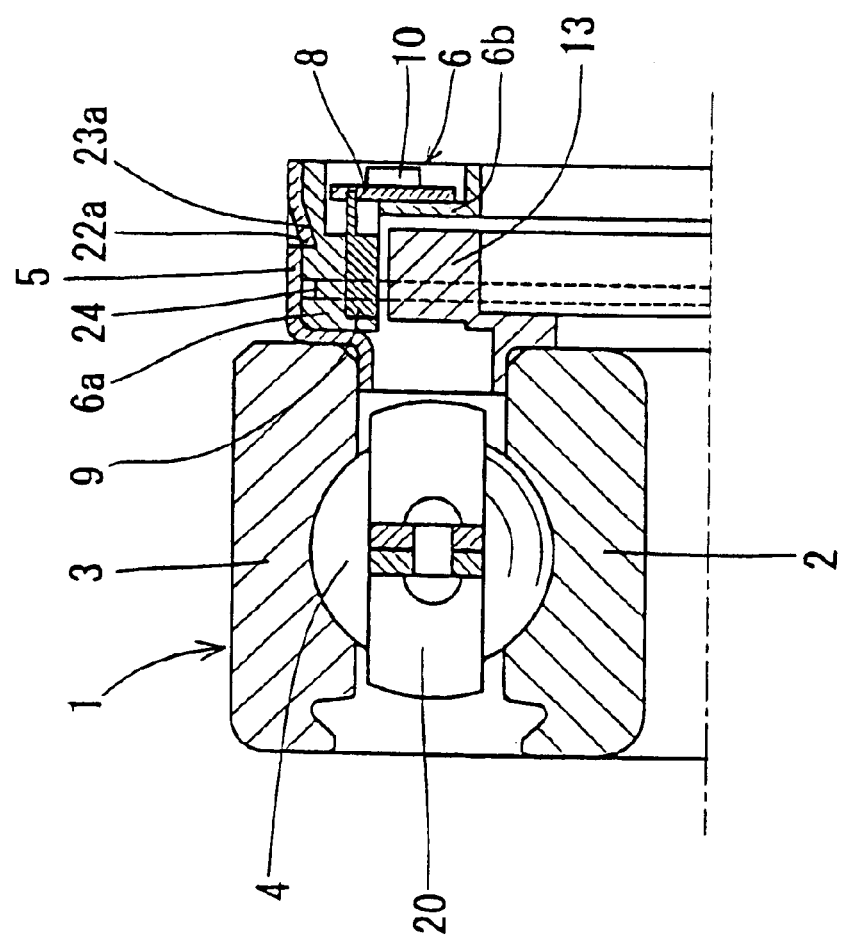
FIG. 16B is a vertical sectional side view of the same.

Unlike the embodiment shown in FIGS. 14B and FIG. 15, as shown in FIGS. 16A and 16B, the claw-like engaging pieces 22 may be formed such that the bent tips of the engaging pieces 22 are on the side of the rolling bearing 1.

FIGS. 17A, 17B, FIG. 18A, 18B and FIGS. 19A, 19B show other embodiments.

Figure 17A:
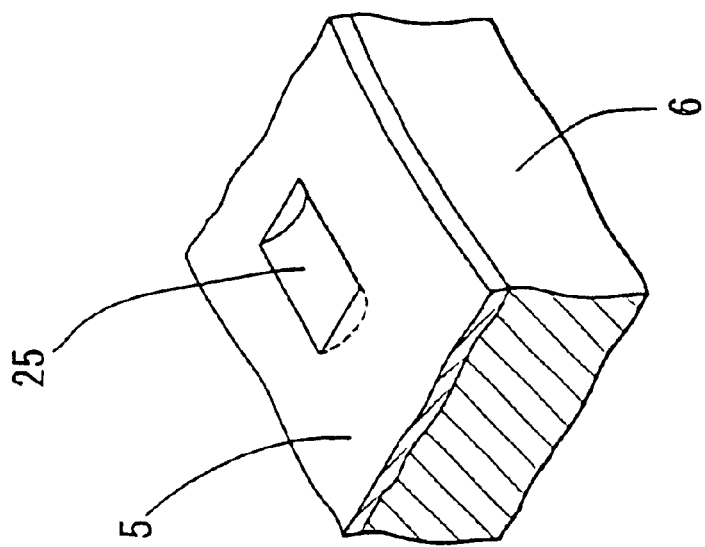
FIGS. 17A, 18A and 19A are perspective views showing other examples of the method of fixing the sensor housing.
Figure 17B:
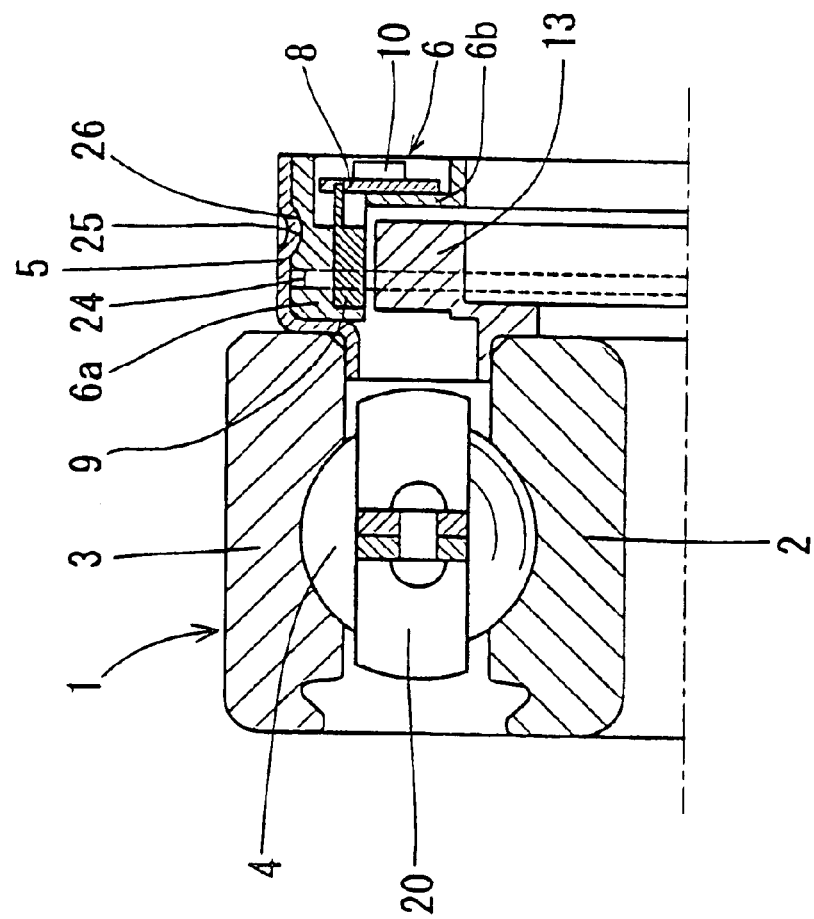
FIGS. 17B, 18B and 19B are vertical sectional side views of the same.

As shown in FIGS. 17A, 17B, the core metal 5 and the sensor housing 6 may be fixed together by circumferentially forming a plurality of axially curving protrusions 25 on the core metal 5 and fitting them in recesses 26 formed in the sensor housing 6.

Figure 18A:
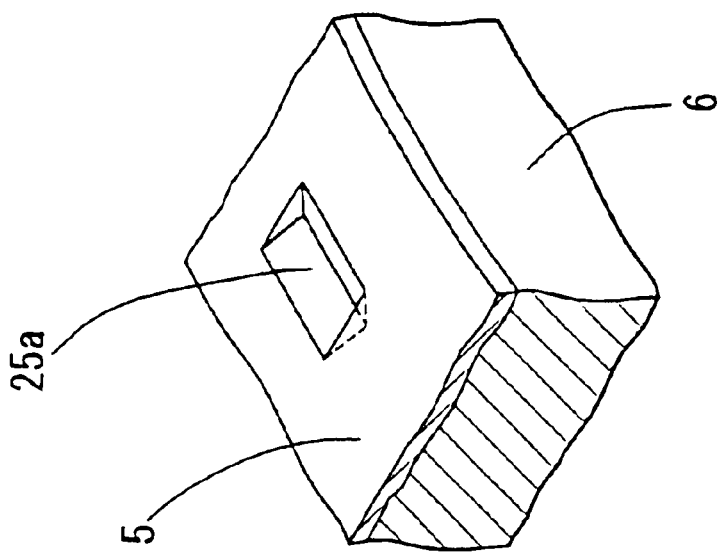
Figure 18B:
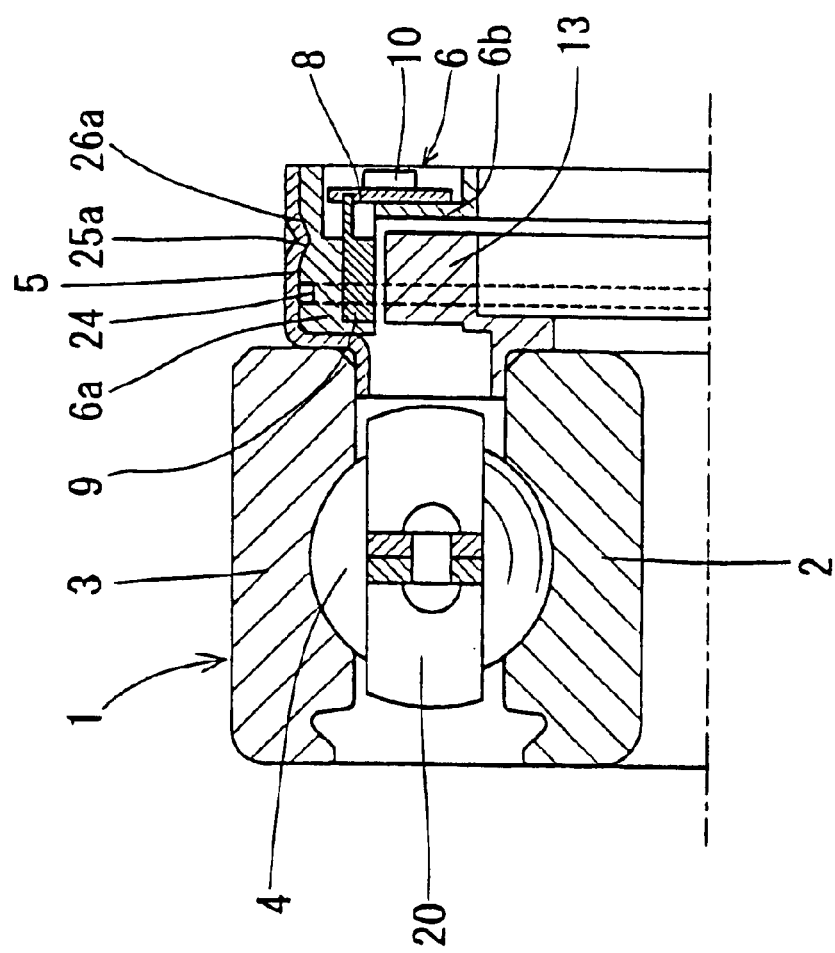

As shown in FIGS. 18A, 18B, the core metal 5 and the sensor housing 6 may be fixed together by circumferentially forming a plurality of protrusions 25a having a V-shaped section on the core metal 5 and fitting them in recesses 26a similarly having a V-shape and formed in the sensor housing 6.

Figure 19A:
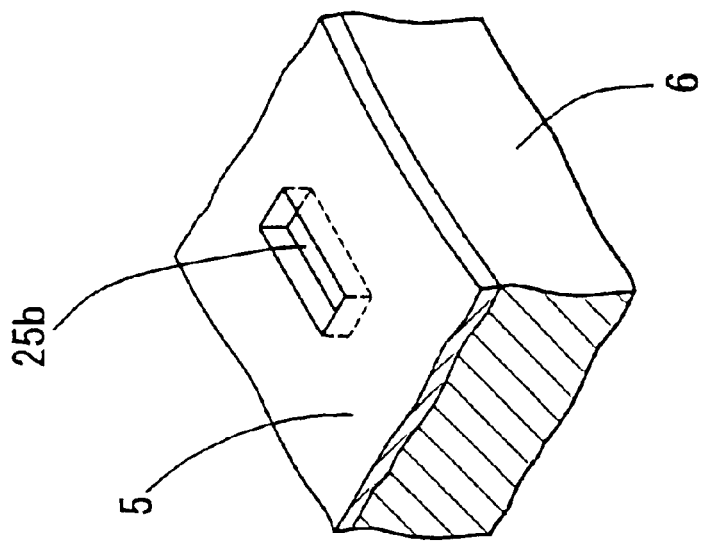
Figure 19B:
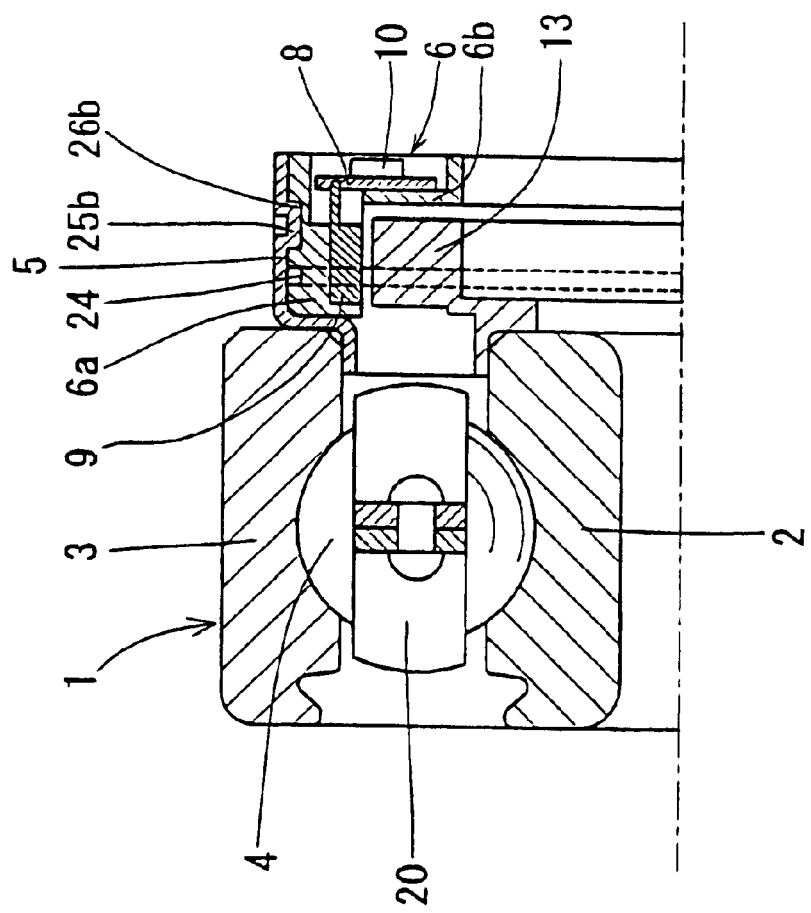

As shown in FIGS. 19A, 19B, the core metal 5 and the sensor housing 6 may be fixed together by forming a plurality of protrusions 25b having a ⊐-shaped section on the core metal 5 and fitting them in recesses 25b having a similar sectional shape and formed in the sensor housing 6.

Thus, in any case, by fixing the core metal 5 and the sensor housing 6 with the protrusion-to-recess engagement, it is possible to reliably prevent the sensor housing 6 from coming off the core metal 5. Also, since the respective protrusions 25, 25a and 25b are all formed in a plurality of numbers in the circumferential direction, it is possible to reliably prevent circumferential displacement. In each embodiment, since an adhesive having elasticity fills the groove 24 formed in the outer periphery of the sensor housing 6 to bond the core metal 5 and the sensor housing 6, even if the sensor housing shrinks in a radial direction due to the influence of the environmental temperature, radial shaking and inclination of the sensor housing can be prevented.

After forming the protrusions 25, 25a or 25b on the core metal 5 beforehand, the sensor housing 6 formed with recesses 26, 26a or 26b having a corresponding shape on its outer peripheral surface may be pressed in the core metal. Also, after the sensor housing 6 has been pressed into the core metal 5, the protrusions may be formed by caulking the core metal to fit them in the recesses.

Figure 20:
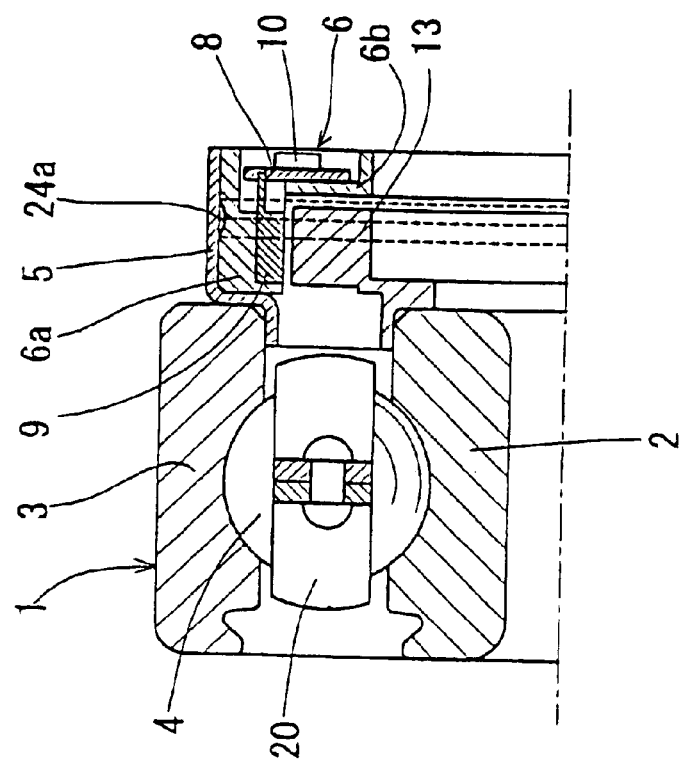
FIG. 20 is a partial vertical sectional side view of the rolling bearing with another example of the adhesive filling groove.
Figure 21A:
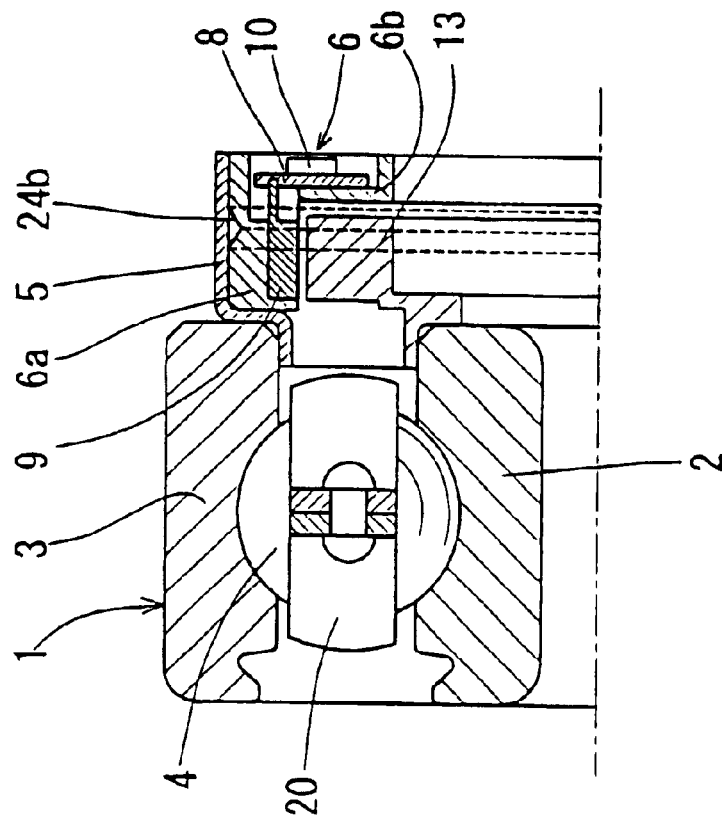
FIGS. 21A and 21B are similar views showing other examples of the adhesive filling groove.
Figure 21B:
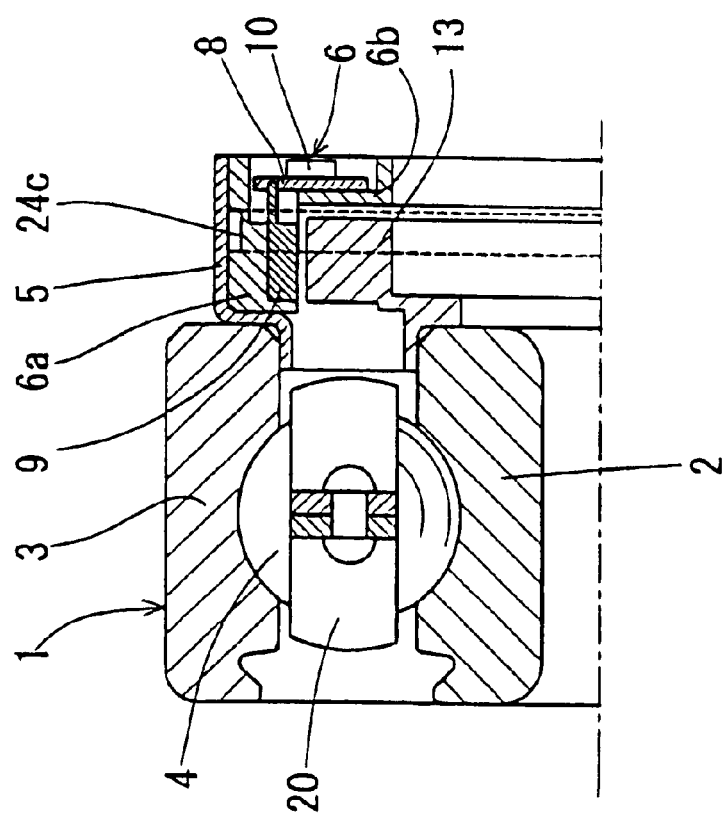
Figure 22:
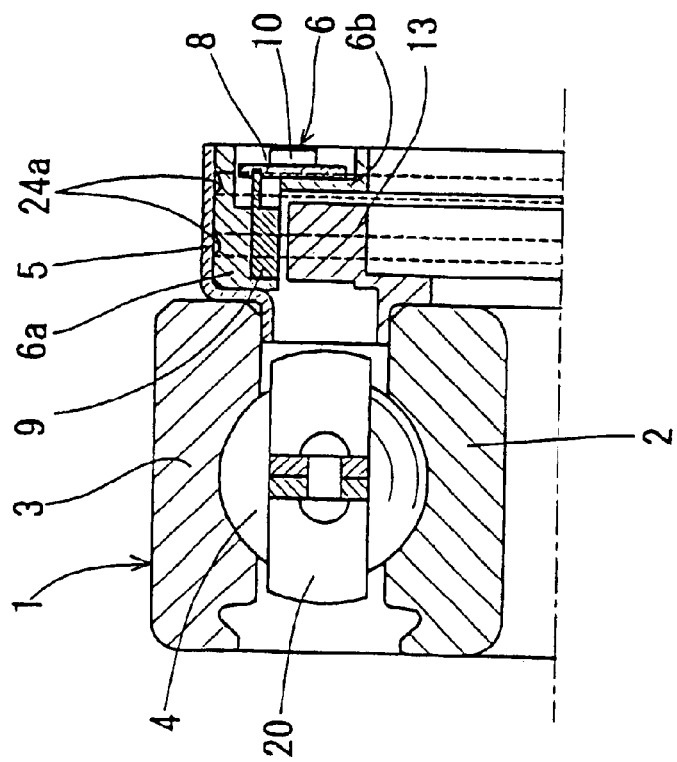
FIG. 22 is a similar view showing an example in which the groove of FIG. 20 is provided by two.
Figure 23A:
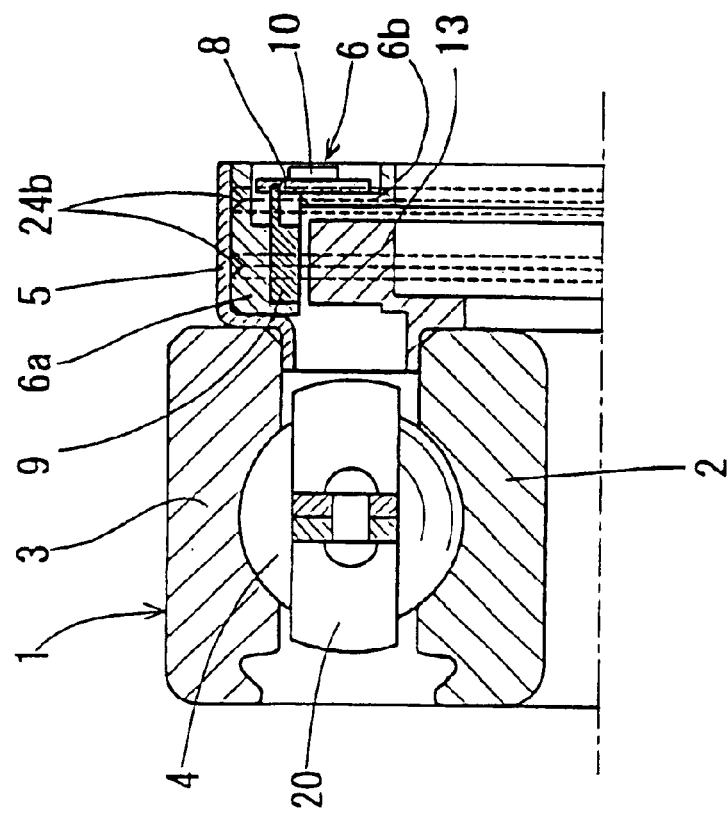
FIGS. 23A and 23B are similar views showing examples in which the grooves of FIGS. 21A and 21B are provided by two, respectively.
Figure 23B:
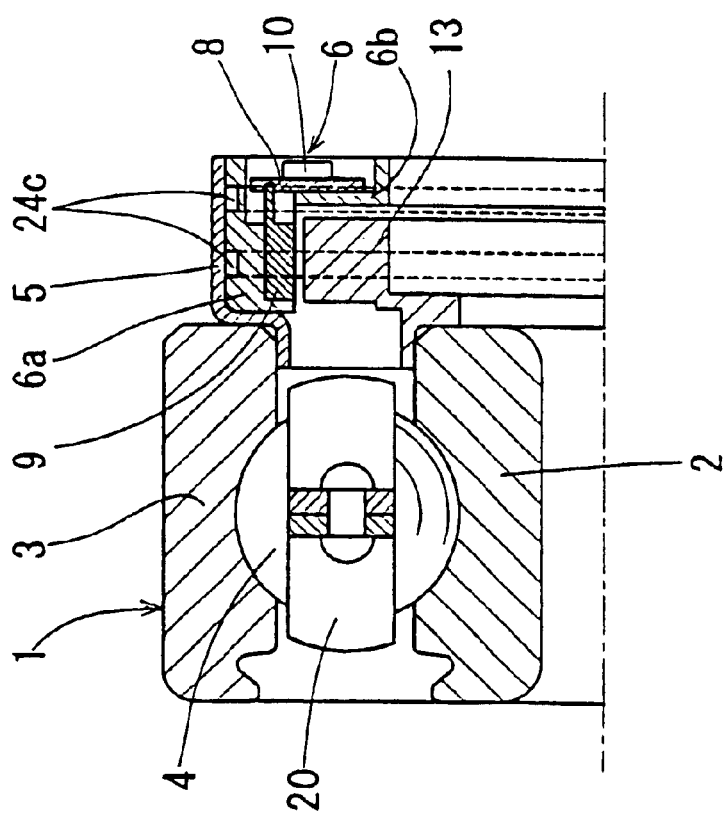

The adhesive filling groove circumferentially continuously formed in the outer peripheral surface of the sensor housing 6 may be any of a groove 24a having such a curved sectional shape as shown in FIG. 20, and grooves 24b and 24c having V-shaped and rectangular sectional shape in an axial direction as shown in FIGS. 21A and 21B. Also, such grooves 24a, 24b and 24c may be formed in a plurality of numbers in the outer peripheral surface of the sensor housing 6, e.g. in two as shown in FIG. 22 and FIGS. 23A, 23B.

These filling grooves 24a, 24b and 24c, the protrusions formed on the core metal 5, and the recesses formed in the sensor housing 6 may be combined to bond the core metal 5 and the sensor housing 6, and fit the protrusions in the respective recesses, thereby preventing radial shaking, axial inclination, circumferential displacement, and coming out of the core metal 5, of the sensor housing 6.

Next, the sixth embodiment of this invention will be described based on FIGS. 24–27.

Figure 24:
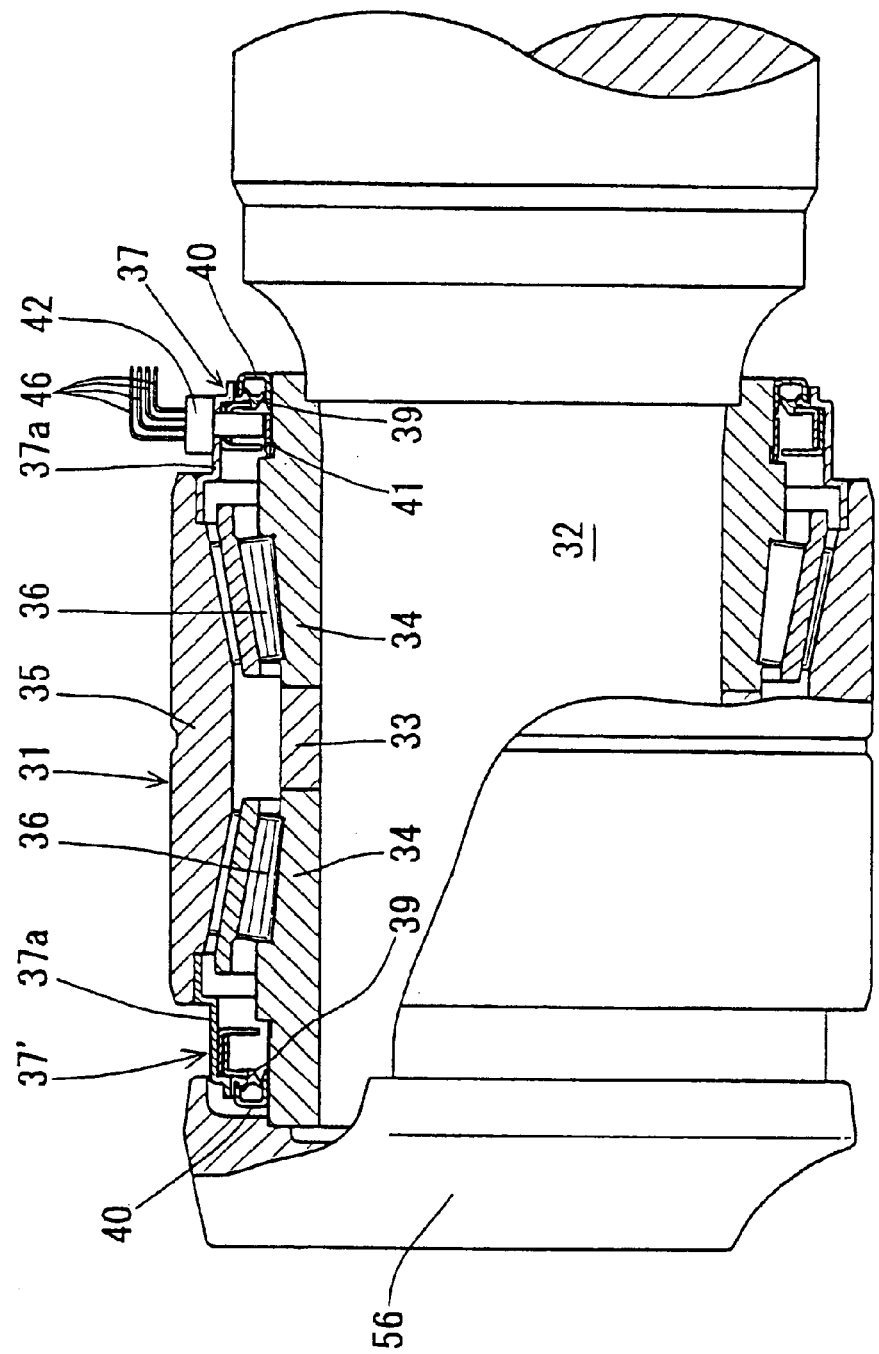
FIG. 24 is a plan view of the sixth embodiment.

FIG. 24 shows a rolling bearing for an axle of a railroad car, i.e. a sealed type tapered roller bearing 31. A spacer 33 and inner rings 34 on both sides thereof are pressed onto the axle 32. Between the inner rings 34 and an outer ring 35, a plurality of tapered rollers 36 are rotatably arranged.

On both sides of the outer ring 35, oil seals 37 and 37', which are cylindrical seal members, are fitted as follows. The oil seals 37, 37' have metallic rings 37a fitted on the diametrically inner surface of the outer ring 35 at both ends, and core metals 38a, 38b mounted on the inner periphery of the rings 37a. At the tips of the core metals 38b, lip packings 39 are fitted. Their lip portions 39a are in contact with the inner surface of ⊐-shaped seal fitments 40, so that the interior of the bearing 31 is sealed from atmospheric side. To the end of the axle 32, an end cover 56 is fixed by bolts.

At the end of the inner ring on the righthand side of FIG. 24, i.e. on the wheel side, a rotating element 41 is fitted inside the seal fitment 40. Opposite the rotating element 41, a sensor 42 is fixed to the oil seal 37 to form a rotation detecting device.

The rotation detecting element 44, a temperature detecting element 45 and a vibration acceleration detecting element 57 mounted on a circuit board 43 are built in the sensor 42. It is formed by covering these detecting elements 44, 45 and 57 and the circuit board 43 with a synthetic resin.

The rotation detecting element 44 detects a change in e.g. magnetic force with rotation of the rotating element 41 and outputs a pulse signal to a rotating speed control circuit (not shown) connected by a lead wire 46. The temperature detecting element 45 measures the atmospheric temperature in the bearing 31 and outputs to an abnormal temperature detecting circuit (not shown) connected by a lead wire 46 as an electric signal. The vibration acceleration detecting element 57 detects vibration acceleration at the installed position and outputs to an abnormal vibration detecting circuit (not shown) connected by a lead wire as an electric signal.

Figure 27:
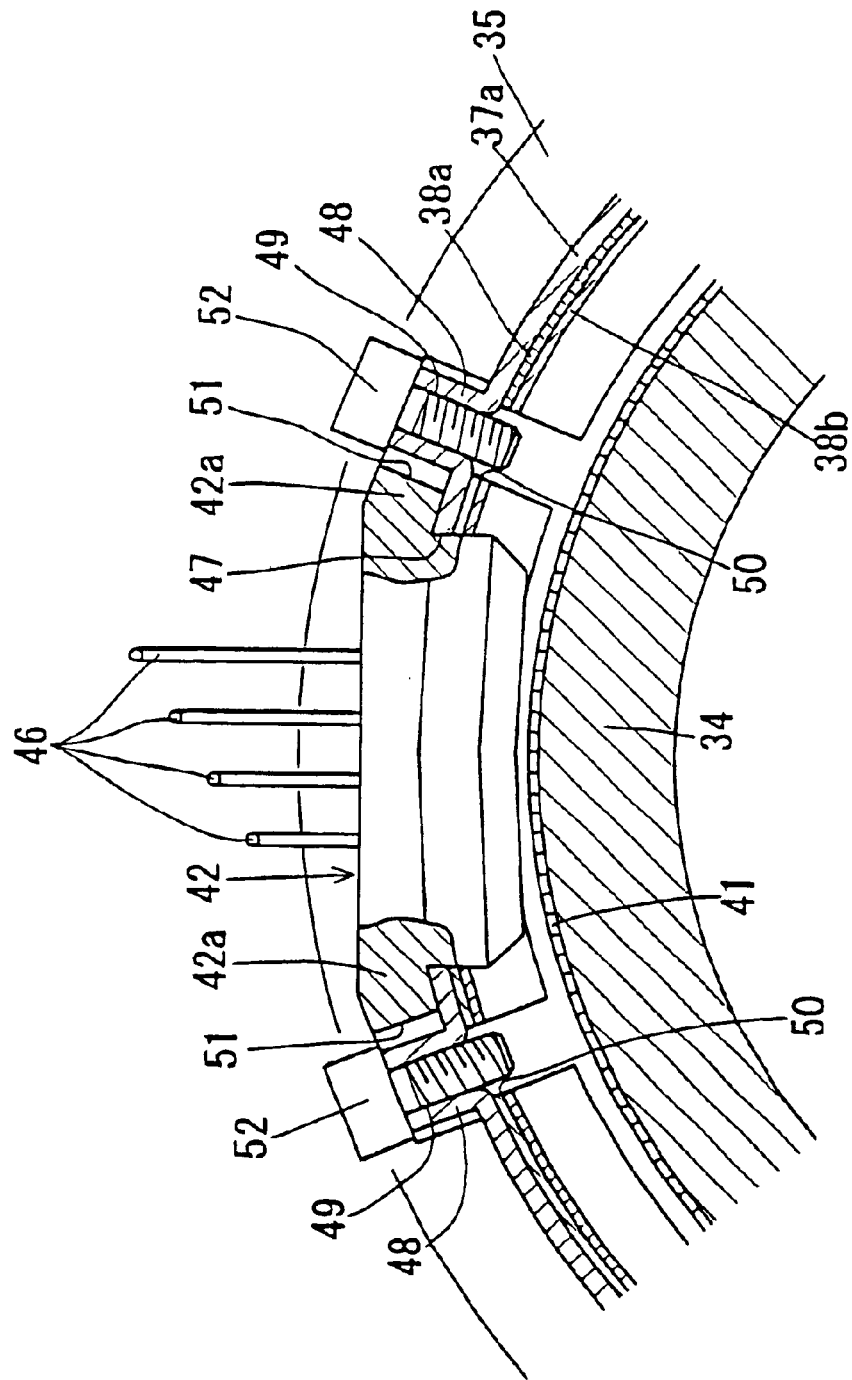
FIG. 27 is a vertical sectional front view of the same taken along line B—B of FIG. 25.

As shown in FIG. 27, in the metallic ring 37a and core metals 38a and 38b of the oil seal 37, holes 47 for the sensor 42 are formed. On both sides of the fitting hole 47 of the metallic ring 37a, cylindrical flanges 48 are formed by burring in the radially outer direction from the metallic ring 37a so as not to protrude from mounting portions 42a at both ends of the sensor 42. On the inner peripheral surfaces of the cylindrical flanges 48, female threads 49 are formed. Through holes 50 larger than the diameter of these threaded holes are formed in the core metals 38a and 38b.

Figure 25:
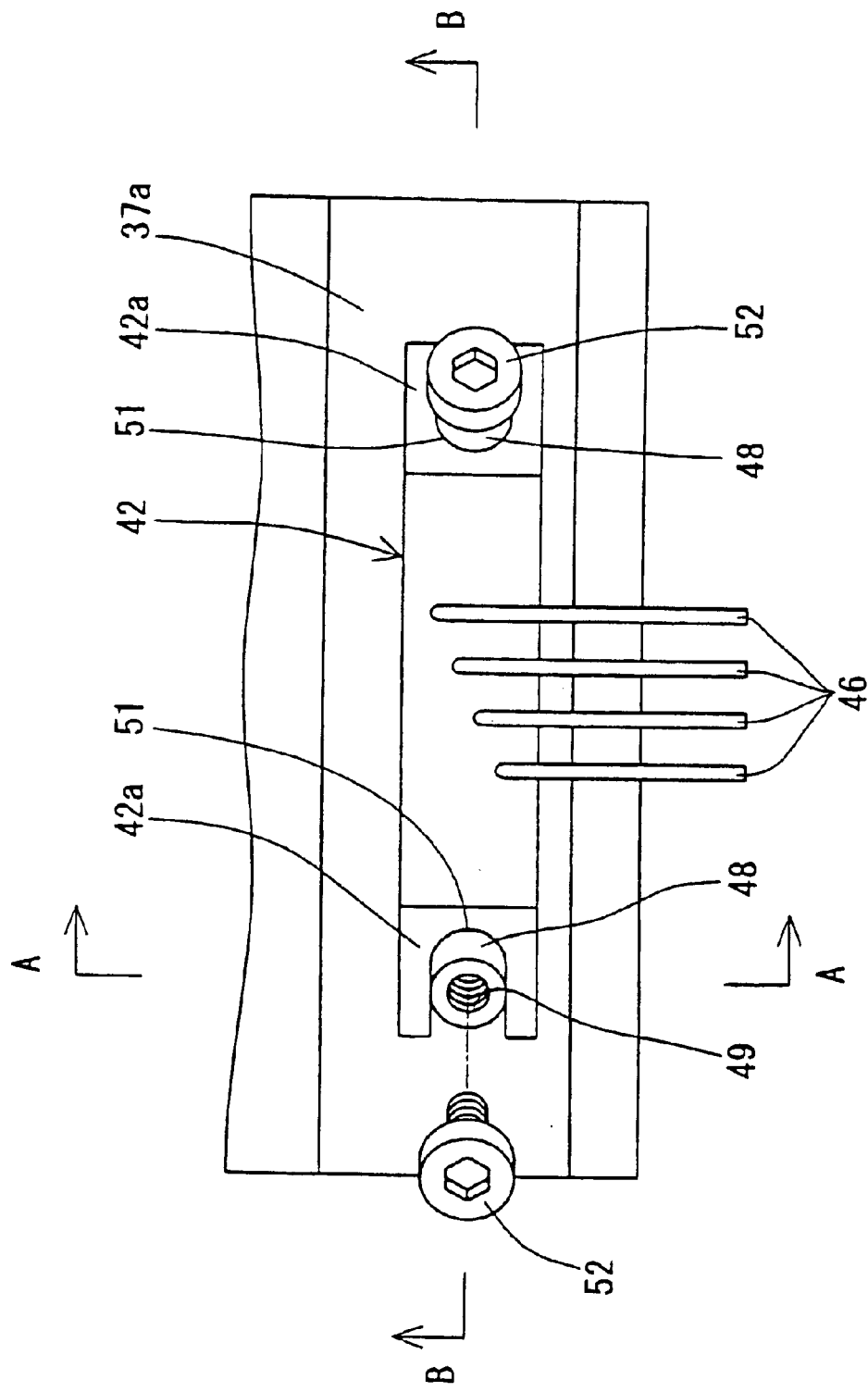
FIG. 25 is an enlarged plan view of a part of the same.

The mounting portions 42a for the sensor 42 have their top surfaces formed obliquely in a direction perpendicular to the cylindrical flanges 48. To the mounting portions 42a, as shown in FIG. 25, U-shaped grooves 51 having one end thereof open are provided to oppose the cylindrical flanges 48. When the sensor 42 is fitted in the fitting hole 47, the cylindrical flanges 48 fit in the U-shaped grooves 51, and by threadedly engaging bolts 52 into the cylindrical flanges 48 to press the edges of the U-shaped grooves 51, the sensor 42 is fixed to the metallic ring 37a. Thus, the rotation detecting device formed by the rotating element 41 and the rotation detecting element 44 built in the sensor 42, the temperature detecting element 45 and the vibration acceleration detecting element 57 are mounted in the tapered roller bearing 31.

The sixth embodiment of this invention is structured as above. Its operation will be described below.

Figure 26:
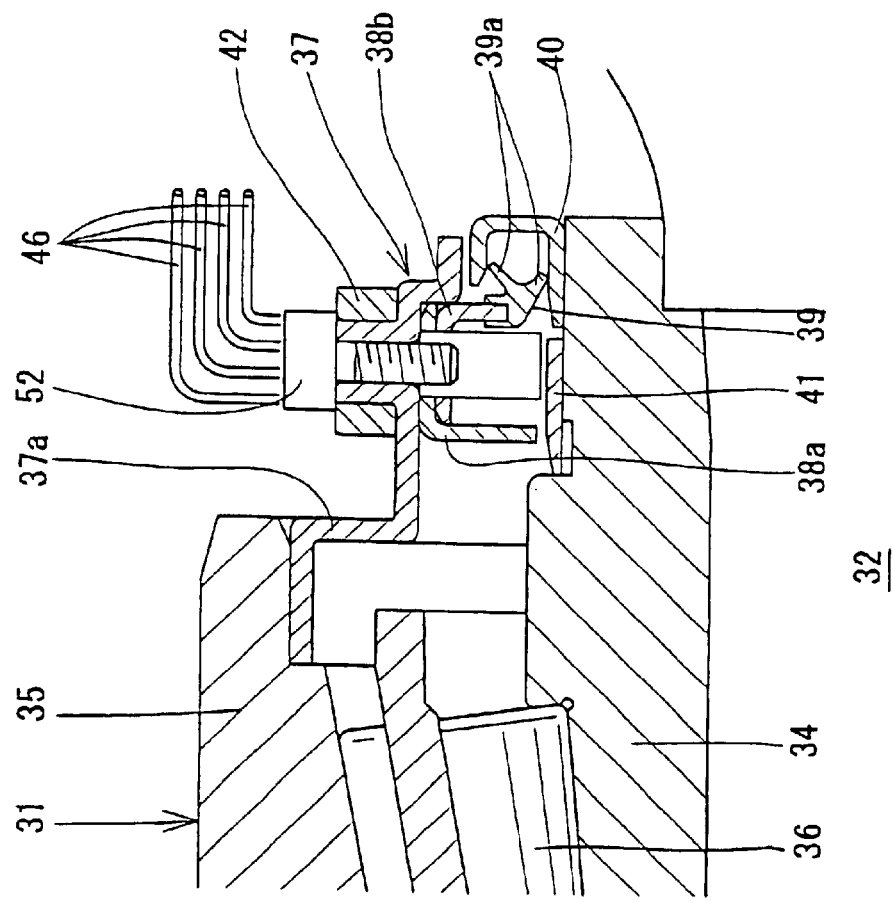
FIG. 26 is a vertical sectional side view of the same taken along line A—A of FIG. 25.

As shown in FIGS. 25–27, only with the bolts 52, without using nuts, the sensor 42 is fixed to the metallic ring 37a of the oil seal 37. Thus, when the sensor 42 is mounted to the oil seal or dismounted, no nuts will drop into the bearing. Also, there is no need to weld nuts to the core metal 38b in order to prevent the nuts from dropping. Thus, it is extremely easy to mount and dismount the sensor 42 to and from the bearing 31. Also, since there is no need to weld nuts, lowering of the production efficiency can be avoided in mass-production of bearings 31.

Since the sensor 42 can be fixed simply by threadedly engaging the bolts 52 with the cylindrical flanges 48, there is no fear of tightening the bolts 52 too much as in the case in which nuts are used. Also, the cylindrical flanges 48, which are formed substantially to the top end of the mounting portions 42a, serve as sleeves. Thus there is no need of fitting bushes into the mounting portions 42a as in the arrangement of tightening using conventional nuts, so that no cracks will develop in the synthetic resin portion of the sensor 42.

Also, since the cylindrical flanges 48 are formed in a radial direction of the metallic ring 37a, strains while forming the cylindrical flanges 48 by burring are uniform, so that no destruction due to tensile stress will occur during working. This makes it easy to form the cylindrical flanges 48.

Since the U-shaped grooves 51 having one end open are formed in the mounting portions 42a of the sensor 42, the cylindrical flanges 48 having their axes inclined from the vertical direction fit easily in the U-shaped grooves 51, so that the sensor 42 can be easily mounted on the oil seal 37.

Figure 28:
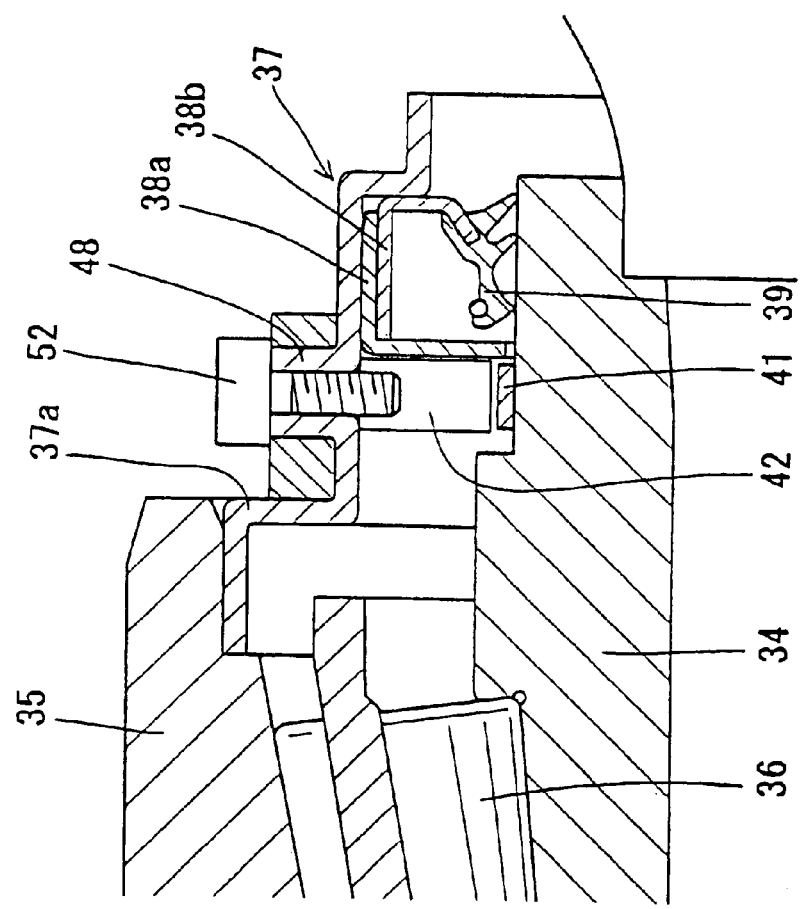
FIG. 28 is a vertical sectional side view of the seventh embodiment.
Figure 29:
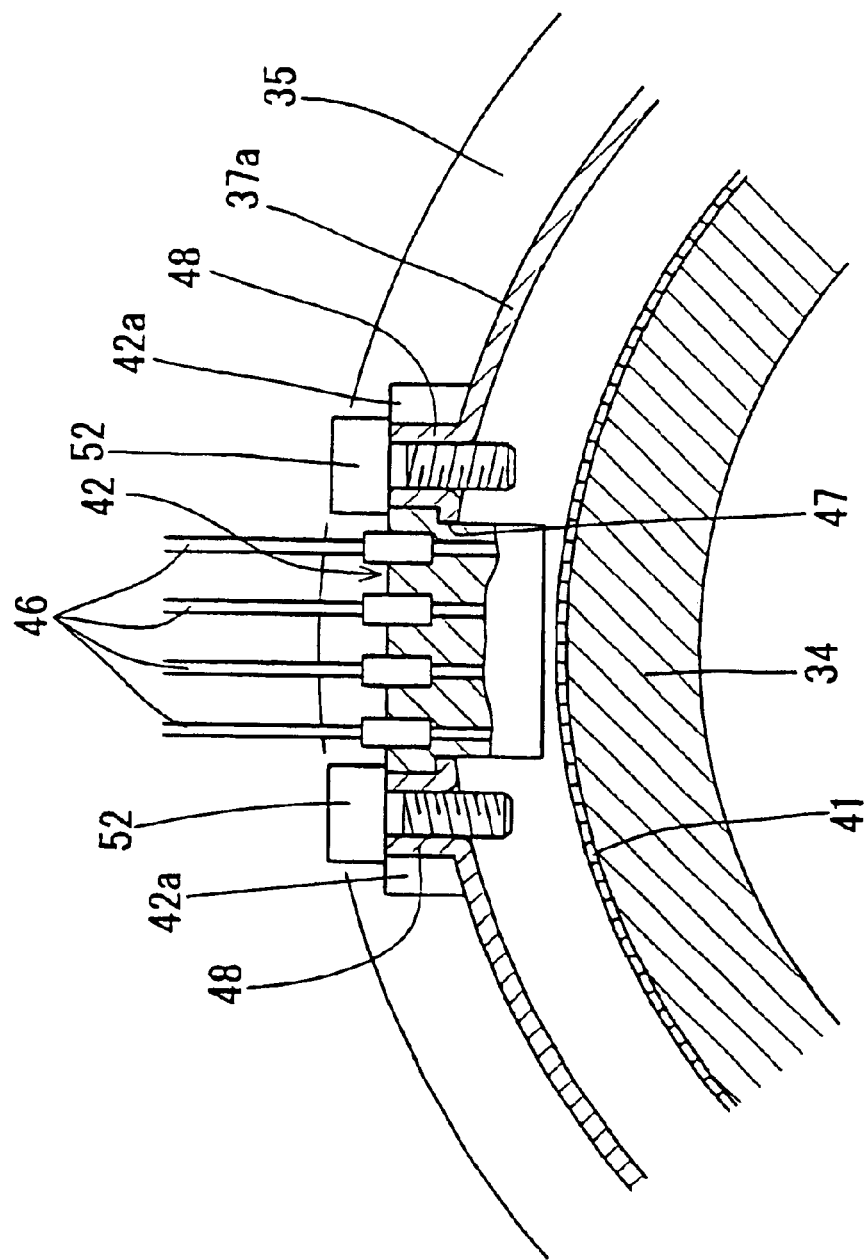
FIG. 29 is a vertical sectional front view of a part of the same.

FIGS. 28 and 29 show a rolling bearing of the seventh embodiment of this invention. It differs from the sixth embodiment in the forming direction of the cylindrical flanges 48 formed on the metallic ring 37a of the oil seal 37 by burring such that the lip packing 39 fitted on the core metal 38b contacts the inner ring 34 so that the interior of the bearing is sealed from the atmospheric side.

The cylindrical flanges 48 in this embodiment are formed on both sides of the fitting holes 47 parallel to the radial centerline of the metallic ring 37a, i.e. outwardly in the vertical direction such that they will not protrude from the mounting portions 42a on both sides of the sensor 42. In the inner peripheral surfaces thereof, female threads 49 are formed. When the sensor 42 is fitted in the fitting holes 47, the cylindrical flanges 48 fit in the U-shaped grooves formed in the mounting portions 42a. By threadedly engaging the bolts 52 with the cylindrical flanges 48, the edge portions of the U-shaped grooves are pressed, so that the sensor 42 is fixed to the metallic ring 37a so as to oppose the rotating element 41.

Thus, by forming the cylindrical flanges 48 in a vertical direction, it is possible to easily fix the sensor 42 to the metallic ring 37a without using nuts. Also, the bolts are easy to threadedly engage and the sensor can be easily fixed. Also, the top surfaces of the mounting portions 42a can be formed horizontally so as to be aligned with the top surface of the sensor 42, which is advantageous in working.

Figure 30:
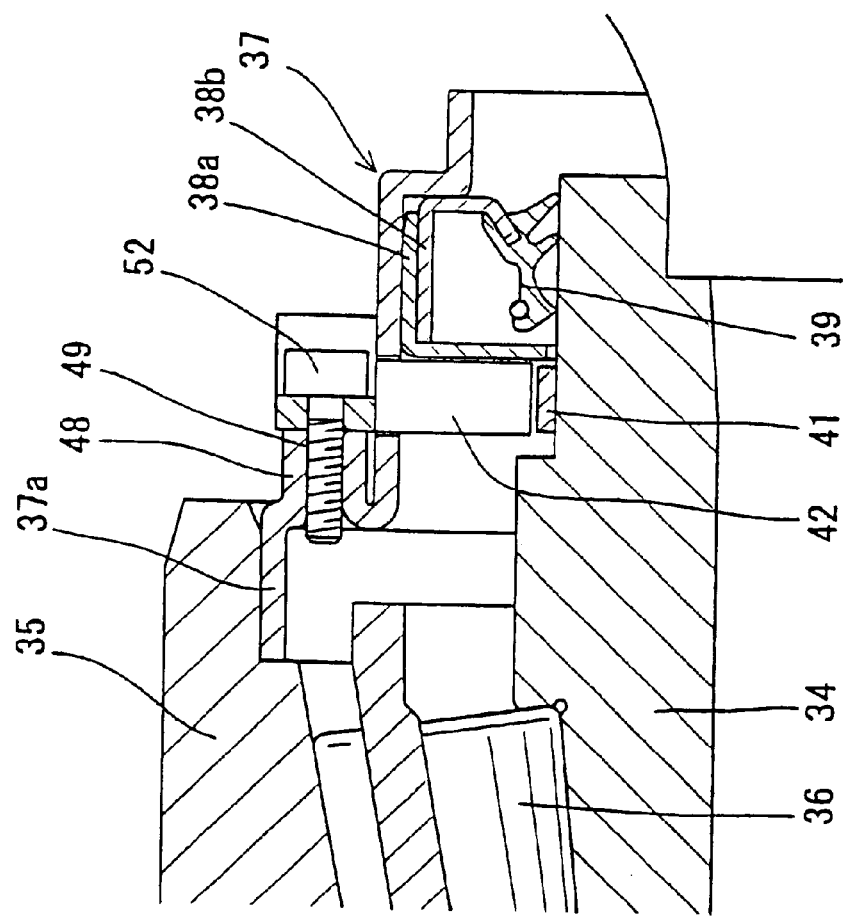
FIG. 30 is a vertical sectional side view of the eighth embodiment.
Figure 31:
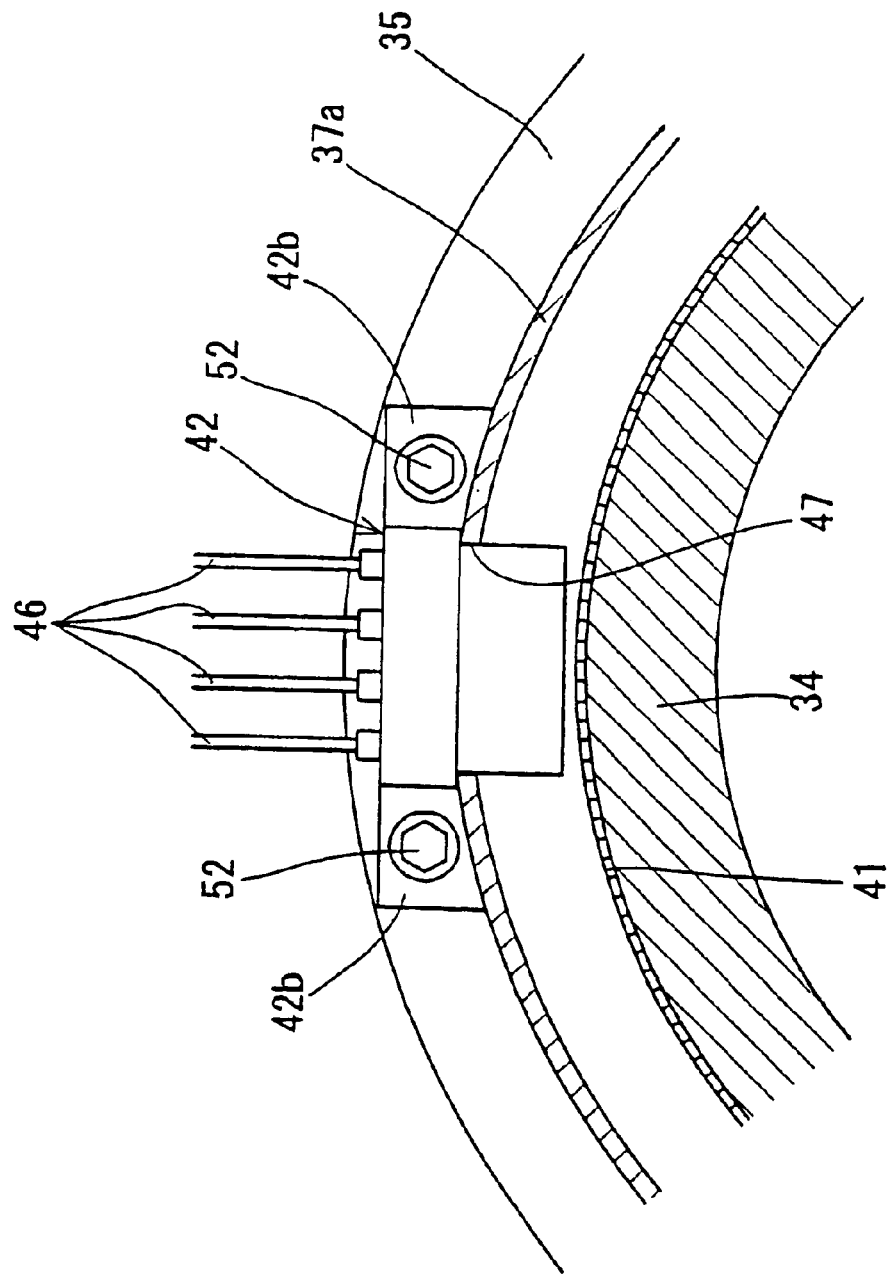
FIG. 31 is a vertical sectional front view of the same.

FIGS. 30 and 31 show a rolling bearing of the eighth embodiment of this invention. It differs from the sixth and seventh embodiments in the forming direction of the cylindrical flanges 48 formed on-the metallic ring 37a of the oil seal 37 by burring. The lip packing 39 fitted on the core metal 38b is in contact with the inner ring 34 so that the interior of the bearing is sealed from the atmospheric side.

The cylindrical flanges 48 in this embodiment are formed axially outwardly of the metallic ring 37a on both sides of the fitting hole 47. On the inner peripheral surfaces thereof, female threads 49 are formed. By fitting the sensor 42 into the fitting holes 47 and threadedly engaging bolts 52 with the cylindrical flanges 48 through bolt holes formed in the mounting portions 42b, the edges of the bolt holes are pressed, so that the sensor 42 is fixed to the metallic ring 37a so as to oppose the rotating element 41. Even though the cylindrical flanges 48 is formed axially, the sensor 42 can be fixed to the metallic ring 37a and the direction in which the bolts 52 for fixing the sensor 42 to the cylindrical flanges 48 are threaded can be not only radial or vertical but also axial. Thus, freedom is given to the fixing of the sensor 42.

The cylindrical flange 48 can be formed by burring not only outwardly of the metallic ring 37a but inwardly when they are formed in radial, vertical or axial direction.

As described above, according to this invention, since the electric circuit board for mounting an electronic circuit part is formed filmy so as to have flexibility, it can be mounted bent in a limited space on the inner peripheral surface of the peripheral wall of the annular sensor housing. Thus, it is possible to make the axial length of the sensor housing shorter than before. Also, since the electric circuit board can be mounted on the sensor housing with different curvatures, it is possible to use the same electric circuit boards for bearings having different model numbers.

With this arrangement, a rolling bearing with a rotation sensor can be made compactly. Thus, it is possible to easily mount a rotation sensor on a rolling bearing having bearing rings of a small width.

Also, by using a heat-resistant rubber for the binder for the magnetic material of the magnetic encoder, it is possible to improve the temperature property of the magnetic encoder and prevent its cracks.

What is claimed is:

1. A rolling bearing with a rotation sensor, comprising a rotating bearing ring, a fixed bearing ring, a rotating element mounted on said rotating bearing ring, a core metal mounted on said fixed bearing ring, an annular sensor housing fitted on said core metal, and a detection element mounted on said sensor housing so as to be adjacent to and oppose said rotating element, wherein said sensor housing is formed with a groove in the outer periphery thereof, said groove being filled with an adhesive to bond said sensor housing to said core metal through said adhesive, and said core metal and said sensor housing are fixed together by fitting a protrusion formed on said core metal in a recess formed in said sensor housing.

2. The rolling bearing with a rotation sensor as claimed in claim 1 wherein said groove formed in said sensor housing is formed so as to extend continuously in a circumferential direction.

3. The rolling bearing with a rotation sensor as claimed in claim 2 wherein said protrusion is a claw-like engaging piece formed on a peripheral wall of said core metal, said recess is a cutout groove, and said engaging piece is bent and fitted in said cutout groove.

4. The rolling bearing with a rotation sensor as claimed in claim 2 wherein said protrusion protrudes toward the inner periphery of said core metal so as to be curved along the axial direction of said core metal, said protrusion comprises a plurality of protrusions formed in the circumferential direction of said core metal, and wherein said recess of said sensor housing comprises a plurality of recesses formed in the circumferential direction so as to oppose said protrusions.

5. The rolling bearing with a rotation sensor as claimed in claim 2 wherein said protrusion comprises a plurality of protrusions having a V-shaped sectional shape in the axial direction of said core metal and formed in the circumferential direction of said core metal, and wherein said recess of said sensor housing comprises a plurality of recesses formed in the circumferential direction so as to oppose said protrusions.

6. The rolling bearing with a rotation sensor as claimed in claim 2 wherein said protrusion comprises a plurality of protrusions having a U-shaped sectional shape in the axial direction of said core metal and formed in the circumferential direction of said core metal, and wherein said recess of said sensor housing comprises a plurality of recesses having a U-shape and formed in the circumferential direction so as to oppose said protrusions.

7. The rolling bearing with a rotation sensor as claimed in claim 1 wherein said protrusion is a claw-like engaging piece formed on a peripheral wall of said core metal, said recess is a cutout groove, and said engaging piece is bent and fitted in said cutout groove.

8. The rolling bearing with a rotation sensor as claimed in claim 1 wherein said protrusion protrudes toward the inner periphery of said core metal so as to be curved along the axial direction of said core metal, said protrusion comprises a plurality of protrusions formed in the circumferential direction of said core metal, and wherein said recess of said sensor housing comprises a plurality of recesses formed in the circumferential direction so as to oppose said protrusions.

9. The rolling bearing with a rotation sensor as claimed in claim 1 wherein said protrusion comprises a plurality of protrusions having a V-shaped sectional shape in the axial direction of said core metal and formed in the circumferential direction of said core metal, and wherein said recess of said sensor housing comprises a plurality of recesses formed in the circumferential direction so as to oppose said protrusions.

10. The rolling bearing with a rotation sensor as claimed in claim 1 wherein said protrusion comprises a plurality of protrusions having a U-shaped sectional shape in the axial direction of said core metal and formed in the circumferential direction of said core metal, and wherein said recess of said sensor housing comprises a plurality of recesses having a U-shape and formed in the circumferential direction so as to oppose said protrusions.

* * * * *